United States Patent
Noh et al.

(10) Patent No.: US 12,406,912 B2
(45) Date of Patent: Sep. 2, 2025

(54) SEMICONDUCTOR PACKAGE

(71) Applicant: Samsung Electronics Co., Ltd., Suwon-si (KR)

(72) Inventors: Hyung Gyun Noh, Hwaseong-si (KR); Keun-Ho Rhew, Seoul (KR); Sang Woo Pae, Suwon-si (KR); Jin Soo Bae, Seongnam-si (KR); Deok-Seon Choi, Hwaseong-si (KR); Il-Joo Choi, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 32 days.

(21) Appl. No.: 17/591,144

(22) Filed: Feb. 2, 2022

(65) Prior Publication Data
US 2023/0029151 A1    Jan. 26, 2023

(30) Foreign Application Priority Data
Jul. 21, 2021    (KR) .................... 10-2021-0095686

(51) Int. Cl.
*H01L 23/498* (2006.01)
*H01L 23/14* (2006.01)
*H01L 23/532* (2006.01)

(52) U.S. Cl.
CPC ........ *H01L 23/49811* (2013.01); *H01L 23/14* (2013.01); *H01L 23/53228* (2013.01)

(58) Field of Classification Search
CPC ... H01L 23/49811; H01L 24/08; H01L 24/02; H01L 24/15
See application file for complete search history.

(56) References Cited

U.S. PATENT DOCUMENTS

| | | | |
|---|---|---|---|
| 8,349,649 B2 | 1/2013 | Kurita | |
| 9,224,681 B2 | 12/2015 | Ebefors et al. | |
| 9,396,998 B2 | 7/2016 | Kurita et al. | |
| 9,673,172 B2 | 6/2017 | Maydar et al. | |
| 10,170,399 B2 | 1/2019 | Ho et al. | |
| 2017/0133333 A1* | 5/2017 | Kim | H01L 24/05 |
| 2021/0057036 A1* | 2/2021 | Khan | H01L 25/18 |
| 2021/0104482 A1* | 4/2021 | Hong | H01L 24/14 |
| 2021/0125955 A1 | 4/2021 | Suh et al. | |
| 2021/0375790 A1* | 12/2021 | Oda | H01L 24/80 |

FOREIGN PATENT DOCUMENTS

| | | | |
|---|---|---|---|
| JP | H08-153752 A | | 6/1996 |
| JP | 2015090891 A | * | 5/2015 |
| KR | 10-1178840 A | | 9/2012 |

* cited by examiner

*Primary Examiner* — Michele Fan
(74) *Attorney, Agent, or Firm* — Muir Patent Law, PLLC

(57) ABSTRACT

The present disclosure provides a semiconductor package capable of improving performance and reliability. The semiconductor package of the present disclosure includes a first device and a second device that are electrically connected to each other, the first device includes a substrate, a first pad formed on an upper side of the substrate, and a passivation film formed on the upper side of the substrate and formed to surround the first pad, the second device includes a second pad placed to face the first pad, and the first pad has a center pad having a first elastic modulus and an edge pad having a second elastic modulus smaller than the first elastic modulus, the edge pad formed to surround the center pad and to contact the passivation film.

16 Claims, 23 Drawing Sheets

FIG. 13
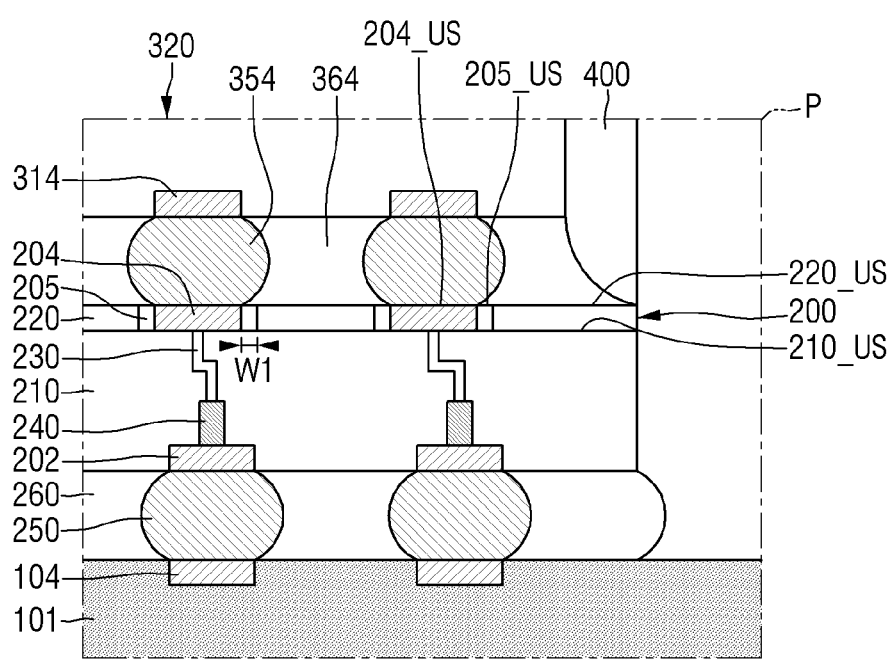
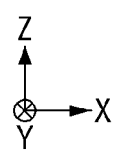

SEMICONDUCTOR PACKAGE

CROSS-REFERENCE TO RELATED APPLICATION

This application claims priority to Korean Patent Application No. 10-2021-0095686 filed on Jul. 21, 2021 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a semiconductor package. More specifically, the present disclosure relates to a decrease in thermal stress of a passivation film using a stress relaxation pad (an edge pad).

2. Description of the Related Art

The interposer market is growing by a demand of a high specification of set and an adoption of high bandwidth memory (HBM). For example, in the case of a semiconductor package that uses a silicon-based interposer, the semiconductor package may be fabricated by surface-mounting a semiconductor chip on the silicon-based interposer, and by molding the mounted semiconductor chip with a molding material.

On the other hand, due to the high specification of set in the recent years, the number of high-bandwidth memories has increased, and the size of semiconductor packages has enlarged. This induces problems that increase a stress caused by a difference in coefficient of thermal expansion (CTE), increase the process difficulty of the semiconductor package, and decrease the yield.

SUMMARY

Aspects of the present disclosure provide a semiconductor package capable of improving performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package comprising, a first device and a second device that are electrically connected to each other, wherein the first device includes a substrate, a first pad formed on an upper side of the substrate, and a passivation film formed on the upper side of the substrate and formed to surround the first pad, the second device includes a second pad placed to face the first pad, and the first pad has a center pad having a first elastic modulus and an edge pad having a second elastic modulus smaller than the first elastic modulus, the edge pad formed to surround the center pad and to contact the passivation film.

According to another aspect of the present disclosure, there is provided a semiconductor package comprising, an interposer substrate, and a semiconductor chip which is mounted on the interposer substrate and electrically connected to the interposer substrate, wherein the interposer substrate includes an interposer, a passivation film which is in contact with an upper side of the interposer, an interposer pad which penetrates the passivation film and is electrically connected to a redistribution layer inside the interposer, and a stress relaxation pad which penetrates the passivation film and surrounds the interposer pad, and wherein an upper side of the interposer pad is located on the same plane as an upper side of the stress relaxation pad.

According to another aspect of the present disclosure, there is provided a semiconductor package comprising, a circuit board, an interposer substrate on the circuit board, and a logic semiconductor chip and a memory semiconductor chip mounted on the interposer substrate and electrically connected to the interposer substrate, wherein the interposer substrate includes an interposer, an interposer pad which is placed on an upper side of the interposer and includes a conductive material, a stress relaxation pad which is placed on the upper side of the interposer, surrounds a periphery of the interposer pad, and includes an insulating material, and a passivation film which surrounds a periphery of the stress relaxation pad, on the upper side of the interposer, wherein a width of the stress relaxation pad is 1 μm or more and 10 μm or less.

BRIEF DESCRIPTION OF THE DRAWINGS

The above and other aspects and features of the present disclosure will become more apparent by describing in detail exemplary embodiments thereof with reference to the attached drawings, in which:

FIG. 13 is an enlarged view for explaining a region P of FIG. 12.

DETAILED DESCRIPTION OF THE EMBODIMENTS

Hereinafter, semiconductor packages according to some embodiments will be described referring to FIGS. 1 to 23.

Figure 1:
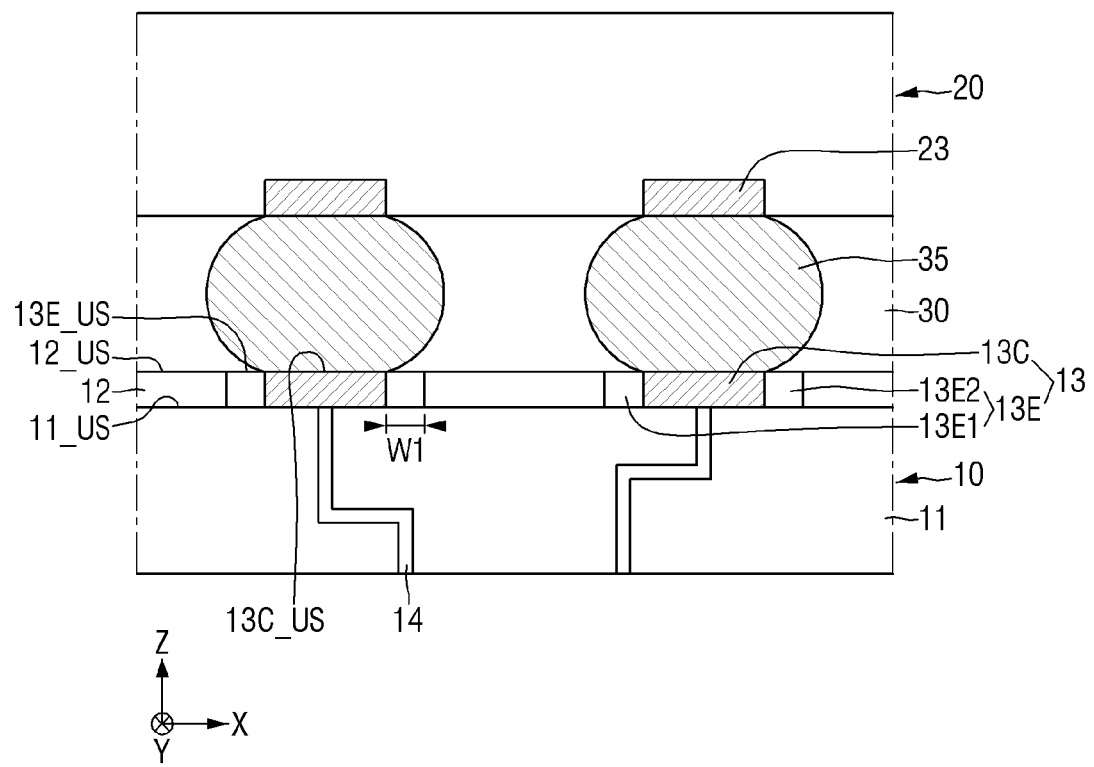
FIG. 1 is an exemplary diagram for explaining a semiconductor package according to some embodiments.
Figure 2:
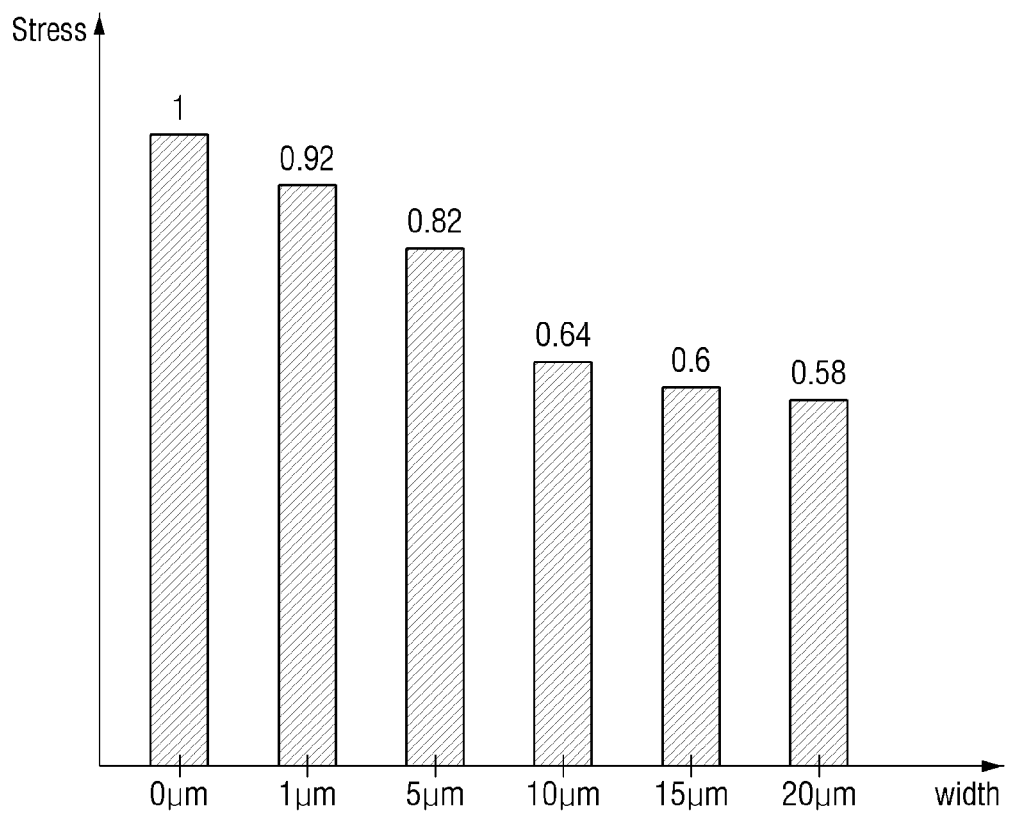
FIG. 2 is a graph showing a relationship between a width of the edge pad of FIG. 1 and a thermal stress of the passivation film.

FIG. 1 is an exemplary diagram for explaining a semiconductor package according to some embodiments. FIG. 2 is a graph showing a relationship between a width of the edge pad of FIG. 1 and a thermal stress of the passivation film.

Referring to FIGS. 1 and 2, the semiconductor package according to some embodiments may include a first device 10 and a second device 20.

The first device 10 and the second device 20 may be electrically connected to each other. For example, the first device 10 and the second device 20 may be electrically connected to each other through a first pad 13, a second pad 23, and a solder bump 35. Each of the first device 10 and the second device 20 may be, for example, a circuit board, an interposer, a logic semiconductor chip, or a memory semiconductor chip.

As used herein, components described as being "electrically connected" are configured such that an electrical signal can be transferred from one component to the other (although such electrical signal may be attenuated in strength as it transferred and may be selectively transferred).

The first device 10 may include a substrate 11, a passivation film 12, a first pad 13, and a redistribution layer/pattern 14. Although not shown, the first device 10 may include an insulating layer, and may also include through electrodes.

The substrate 11 may include or may be, for example, at least one of a silicon-based interposer, a circuit board, a logic semiconductor chip, and a memory semiconductor chip. In the present specification, the substrate 11 will be described as including a silicon-based interposer.

The first pad 13 may be formed on the substrate 11. The first pad 13 may be placed on an upper side (or a top/upper surface) 11_US of the substrate 11. The first pad 13 may come into contact with the upper side 11_US of the substrate 11.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second pad 23 may be placed to face the first pad 13. The first device 10 and the second device 20 may be electrically connected to each other, using the first pad 13 and the second pad 23. The second pad 23 may include or be formed of, for example, but is not limited to, metallic materials such as copper (Cu) or aluminum (Al). The contents of the first pad 13 will be described later.

In some embodiments, the first pad 13 may include a center pad 13C and an edge pad 13E. The edge pad 13E may be formed to surround the center pad 13C. The center pad 13C may include or be formed of a conductive material. For example, the center pad 13C may include or be formed of, but is not limited to, metallic materials such as copper (Cu) or aluminum (Al).

The edge pad 13E may include or be formed of an insulating material. The edge pad 13E may include or be formed of an oxide-based insulating material. For example, the edge pad 13E may be formed of, but is not limited to, tetraethyl ortho silicate (TEOS) or photo-sensitive polyimide (PSPI). The edge pad 13E may be formed of a material capable of relieving the thermal stress of the passivation film 12 to be described later.

The edge pad 13E may have a width W1 in a first direction X. The width W1 of the edge pad 13E may be 1 μm or more and 20 μm or less. For example, the width W1 of the edge pad 13E may be 1 μm or more and 10 μm or less. For example, the width W1 of the edge pad 13E may be 5 μm or more and 10 μm or less.

The edge pad 13E may vertically overlap the solder bump 35. For example, the edge pad 13E may completely overlap the solder bump 35 in the second direction Z. As used herein, the first direction X may be a horizontal direction. The second direction Z may be a vertical direction. The first direction X and the second direction Z may be perpendicular to each other. However, the technical idea of the present disclosure is not limited thereto.

In FIG. 2, an x-axis means/represents a width of the edge pad 13E in the first direction X. A y-axis means/represents a thermal stress of the passivation film 12. For example, the width of the edge pad 13E may be a distance from a surface of the edge pad 13E contacting the center pad 13C to a surface of the edge pad 13E positioned in a direction receding from a center of the center pad 13C and contacting the passivation film 12.

When the edge pad 13E is not formed, e.g., when the width of the edge pad 13E is 0 μm, the thermal stress of the passivation film 12 is defined as 1.

When the width W1 of the edge pad 13E is 1 μm, the thermal stress of the passivation film 12 is 0.92. The thermal stress of the passivation film 12, when the width W1 of the edge pad 13E is 1 μm, may be reduced by about 8% as compared to a case where the edge pad 13E is not formed (when the width of the edge pad 13E is 0 μm).

When the width W1 of the edge pad 13E is 5 μm, the thermal stress of the passivation film 12 is 0.82. The thermal stress of the passivation film 12, when the width W1 of the edge pad 13E is 5 μm, may be reduced by about 18% as compared to a case where the edge pad 13E is not formed (when the width of the edge pad 13E is 0 μm).

When the width W1 of the edge pad 13E is 10 μm, the thermal stress of the passivation film 12 is 0.64. The thermal stress of the passivation film 12, when the width W1 of the edge pad 13E is 10 μm, may be reduced by about 36% compared to a case where the edge pad 13E is not formed (when the width of the edge pad 13E is 0 μm).

When the width W1 of the edge pad 13E is 15 μm, the thermal stress of the passivation film 12 is 0.6. The thermal stress of the passivation film 12, when the width W1 of the edge pad 13E is 15 μm, may be reduced by about 40% compared to a case where the edge pad 13E is not formed (when the width of the edge pad 13E is 0 μm).

When the width W1 of the edge pad 13E is 20 μm, the thermal stress of the passivation film 12 is 0.58. The thermal stress of the passivation film 12, when the width W1 of the edge pad 13E is 20 μm, may be reduced by about 42% compared to a case where the edge pad 13E is not formed (when the width of the edge pad 13E is 0 μm).

The center pad 13C may have a first modulus. The edge pad 13E may have a second modulus. The term "modulus" is a mechanical property that measures the stiffness of a solid material. The modulus is a modulus of elasticity that defines a relationship between stress and strain of a linear elastic material in a uniaxial deformation region. In general, a material having a high modulus may be a material having a high rigidity. For example, the first modulus and the second modulus may be elastic modulus or Young's modulus of the center pad 13C and the edge pad 13E.

In some embodiments, the first modulus of the center pad 13C may be greater than the second modulus of the edge pad 13E. For example, the rigidity of the center pad 13C may be greater than the rigidity of the edge pad 13E. The thermal stress of the passivation film 12 may be relaxed, using a difference between rigidity of the center pad 13C and rigidity of the edge pad 13E.

The second modulus of the edge pad 13E may be, for example, but is not limited to, greater than 15 GPa and smaller than 117 GPa.

The edge pad 13E may relax the thermal stress of the passivation film 12. The coefficient of thermal expansion of the edge pad 13E may be 1 ppm/K or more and 17 ppm/K or less. For example, the edge pad 13E may be a material capable of relieving the thermal stress of the passivation film 12, while having a coefficient of thermal expansion of 1 ppm/K or more and 17 ppm/K or less.

The passivation film 12 may be formed on the substrate 11. The passivation film 12 may be placed on the upper side 11_US of the substrate 11. The passivation film 12 may come into contact with the upper side 11_US of the substrate 11. The passivation film 12 may be formed to surround the first pad 13. The passivation film 12 may come into contact with the edge pad 13E. The passivation film 12 may not come into contact with the center pad 13C.

The passivation film 12 may be, for example, but is not limited to, a silicon nitride film/layer. For example, the passivation film 12 may include or be formed of a nitride-based insulating material. The passivation film 12 may be made up of a passivation material, BCB (benzocyclobutene), polybenzeneoxazole, polyimide, epoxy, silicon oxide, silicon nitride, or a combination thereof.

In some embodiments, a height of the center pad 13C in the second direction Z may be the same as a height of the edge pad 13E in the second direction Z. An upper side (a top/upper surface) 13C_US of the center pad 13C may be located on the same plane as an upper side (a top/upper surface) 13E_US of the edge pad 13E. A height of the passivation film 12 in the second direction Z may be the same as the heights of the center pad 13C and the edge pad 13E in the second direction Z. An upper side (a top/upper surface) 12_US of the passivation film 12 may be located on the same plane as the upper side 13C_US of the center pad 13C and the upper side 13E_US of the edge pad 13E.

The redistribution layer/pattern 14 may be formed inside the substrate 11. The redistribution layer 14 may be electrically connected to the first pad 13. The redistribution layer 14 may be electrically connected to the center pad 13C. The redistribution layer 14 may include or be formed of a conductive material. The redistribution layer 14 may include or be formed of, for example, but is not limited to, at least one of copper (Cu), aluminum (Al), silver (Ag), tin (Sn), gold (Au), nickel (Ni), lead (Pb), titanium (Ti), and alloys thereof.

The semiconductor package according to some embodiments may further include a solder bump 35 and an underfill 30.

The first device 10 and the second device 20 may be electrically connected to each other through the solder bump 35. The first pad 13 and the second pad 23 may be electrically connected to each other through the solder bump 35.

The solder bump 35 may electrically connect the first device 10 and the second device 20. The solder bump 35 may include or be formed of solder material. The solder bump 35 may include or be formed of, for example, but is not limited to, at least one of lead (Pb), tin (Sn), indium (In), bismuth (Bi), antimony (Sb), silver (Ag), and alloys thereof.

The underfill 30 may be formed between the first device 10 and the second device 20. The underfill 30 may fill a space between the first device 10 and the second device 20. Also, the underfill 30 may cover the solder bump 35. For example, the underfill 30 may surround and contact side surfaces of solder bumps 35. The underfill 30 may include or be formed of, for example, but is not limited to, an insulating polymeric material such as an EMC (epoxy molding compound).

FIGS. 3 to 6 are exemplary diagrams for explaining a semiconductor package according to some embodiments. For convenience of explanation, points/aspects different from those described using FIGS. 1 and 2 will be mainly described.

Figure 3:
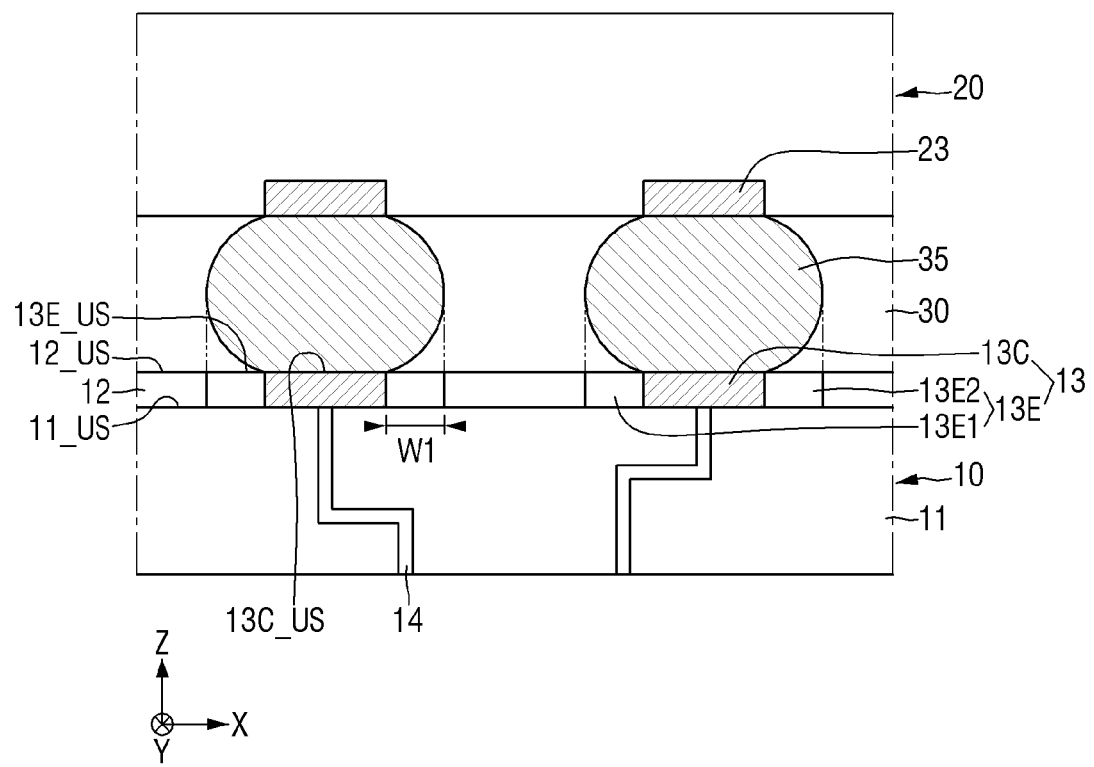
FIGS. 3 to 6 are exemplary diagrams for explaining semiconductor packages according to some embodiments.

Referring to an embodiment illustrated in FIG. 3, as shown in the cross-section, the width/distance between the outer sides of the edge pad 13E in the first direction X may be the same as a width of the solder bump 35 in the first direction X. The outer side of the edge pad 13E may be a portion that comes into contact with the passivation film 12. In this case, the edge pad 13E completely overlaps the solder bump 35 in the second direction Z.

Figure 4:
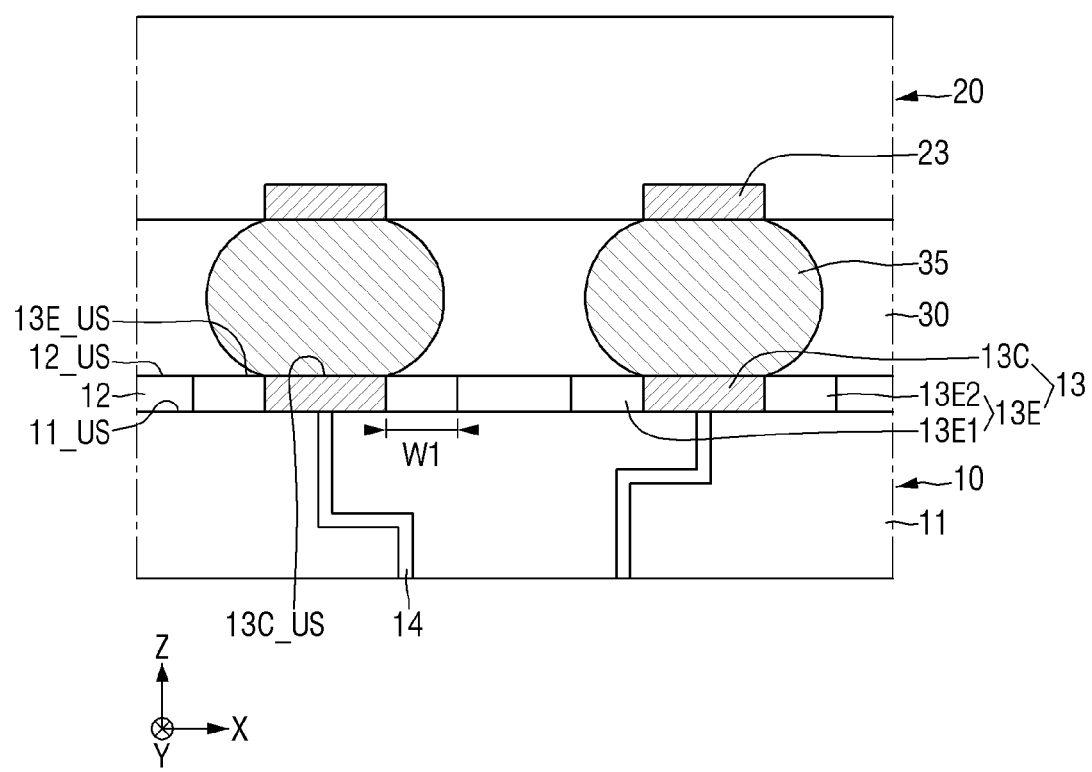

Referring to an embodiment illustrated in FIG. 4, as shown in the cross-section, the width between the outer sides of the edge pad 13E in the first direction X may be greater than the width of the solder bump 35 in the first direction X.

For example, the edge pad 13E may include a portion that does not overlap the solder bump 35 in the second direction Z.

Figure 5:
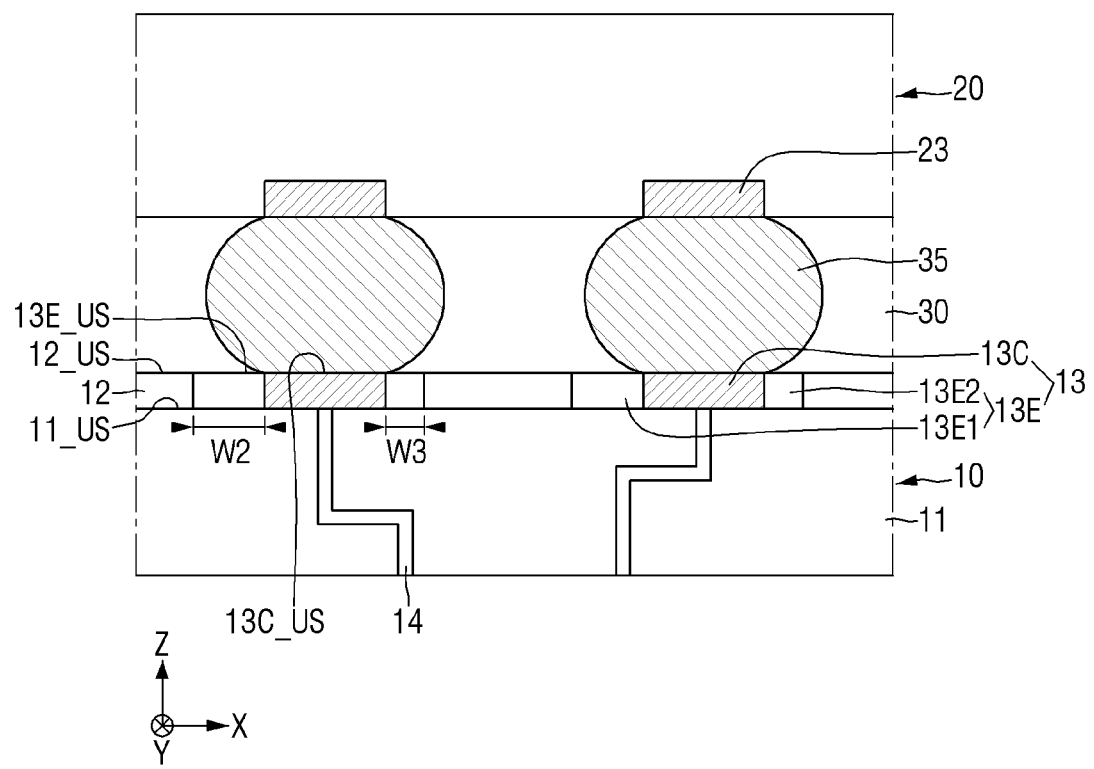

Referring to an embodiment illustrated in FIG. 5, the edge pad 13E may not be symmetrical from the viewpoint of the cross-section.

The edge pad 13E may include a first edge pad 13E1 and a second edge pad 13E2. The first edge pad 13E1 and the second edge pad 13E2 may be respectively placed on one side and the other side of the center pad 13C.

A width W2 of the first edge pad 13E1 in the first direction X may be different from a width W3 of the second edge pad 13E2 in the first direction X. Although the width W2 of the first edge pad 13E1 in the first direction X is shown as being greater than the width W3 of the second edge pad 13E2 in the first direction X, the embodiment is not limited thereto. The width W3 of the second edge pad 13E2 in the first direction X may be greater than the width W2 of the first edge pad 13E1 in the first direction X in certain embodiments.

A part of the first edge pad 13E1 may not overlap the solder bump 35 in the second direction Z. The second edge pad 13E2 may completely overlap the solder bump 35 in the second direction Z. However, the technical idea of the present disclosure is not limited thereto. In certain embodiments, the first edge pad 13E1 and the second edge pad 13E2, while the width W2 of the first edge pad 13E1 in the first direction X is different from the width W3 of the second edge pad 13E2 in the first direction X, both the first edge pad 13E1 and the second edge pad 13E2 may completely overlap the solder bump 35 in the second direction Z.

In certain embodiments, the first edge pad 13E1 and the second edge pad 13E2 may have portions that do not overlap the solder bump 35 in the second direction Z, while the width W2 of the first edge pad 13E1 in the first direction X is different from the width W3 of the second edge pad 13E2 in the first direction X.

Figure 6:
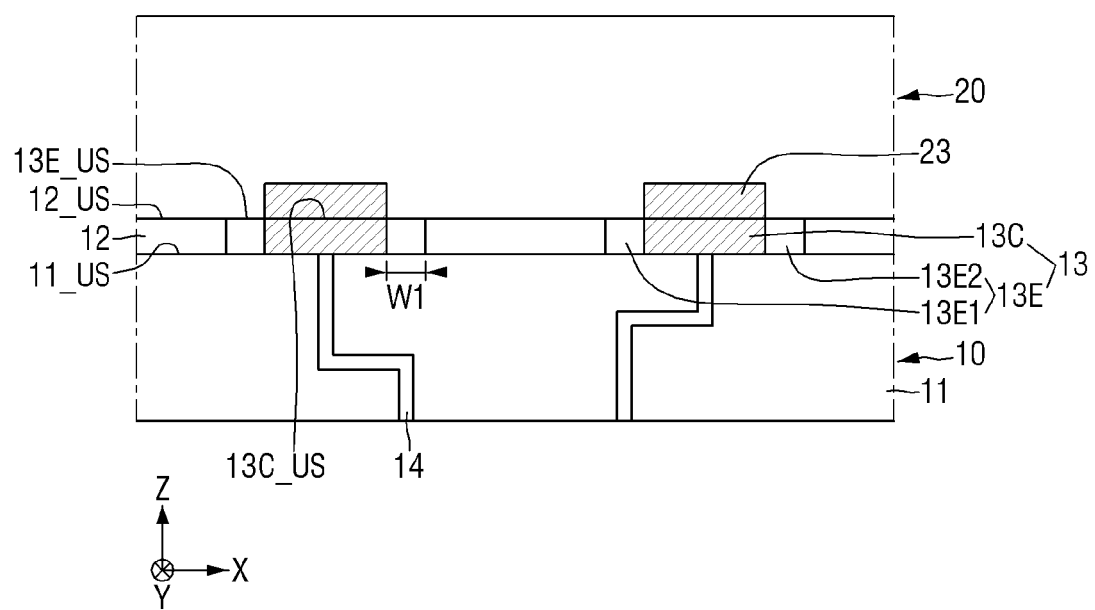

Referring to FIG. 6, the second pad 23 and the first pad 13 may come into contact with each other. For example, the second pad 23 and the center pad 13C may be bonded to each other. In this case, the solder bump 35 may not be included. Although the widths of the second pad 23 and the center pad 13C in the first direction X are shown as being the same as each other, the embodiment is not limited thereto.

FIGS. 7 to 10 are exemplary plan views for explaining an edge pad according to some embodiments. The edge pad according to some embodiments will be described in more detail using FIGS. 7 to 10.

Referring to FIGS. 7 to 10, the center pad 13C may have a circular shape, e.g., in a plan view. Although the center pad 13C is shown as being placed in a zigzag shape in the drawings, the embodiment is not limited thereto.

The edge pad 13E may be formed around the center pad 13C. The edge pad 13E may come into contact with the center pad 13C. The edge pad 13E may include an inner side 13E_a and an outer side 13E_b. The inner side 13E_a of the edge pad 13E may be a side that comes into contact with the center pad 13C. The outer side 13E_b of the edge pad 13E may be opposite to the inner side 13E_a of the edge pad 13E. The outer side 13E_b of the edge pad 13E may come into contact with the passivation film 12. The edge pad 13E may be placed between the center pad 13C and the passivation film 12. The redistribution layer 14 may overlap the center pad 13C.

Figure 7:
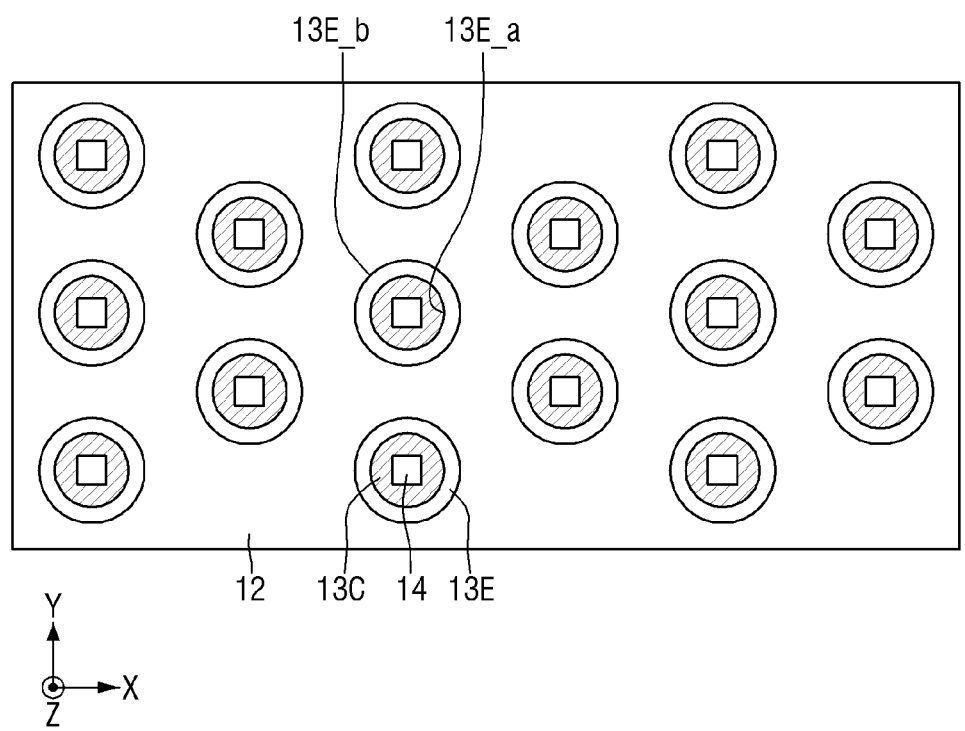
FIGS. 7 to 10 are exemplary plan views for explaining edge pads according to some embodiments.

In FIG. 7, the outer side 13E_b of the edge pad 13E may have a circular shape, e.g., in a plan view. In this case, the width of the edge pad 13E may be the same in a cross-section.

Figure 8:
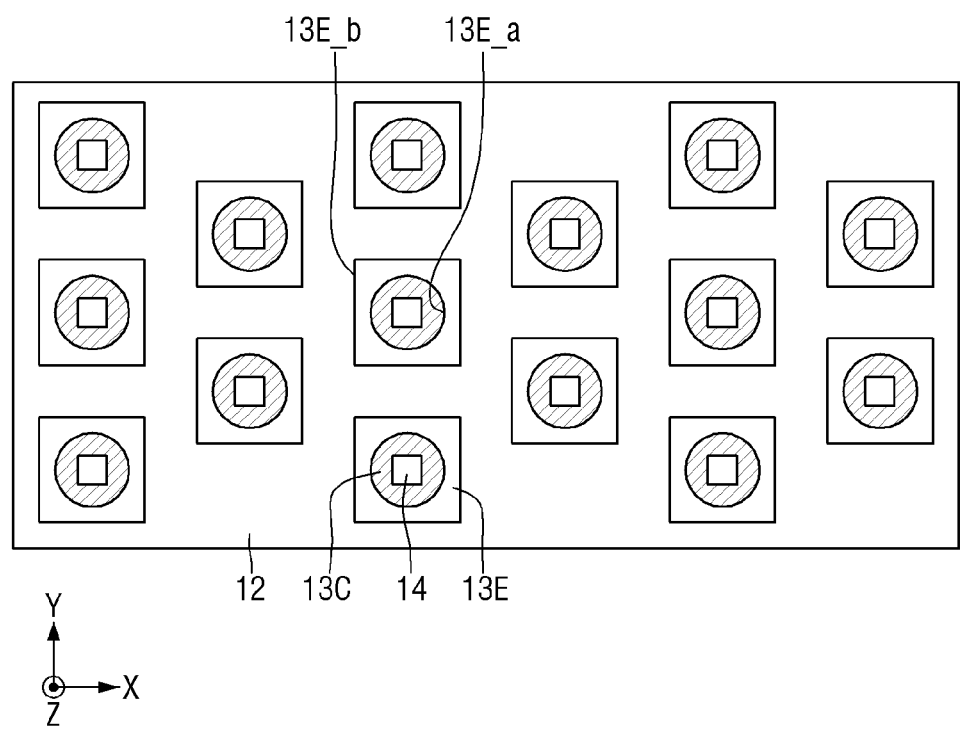

In FIG. 8, the outer side 13E_b of the edge pad 13E may have a square shape, e.g., in a plan view. In this case, the width of the edge pad 13E may differ depending on positon and/or on direction, e.g., in a plan view.

Figure 9:
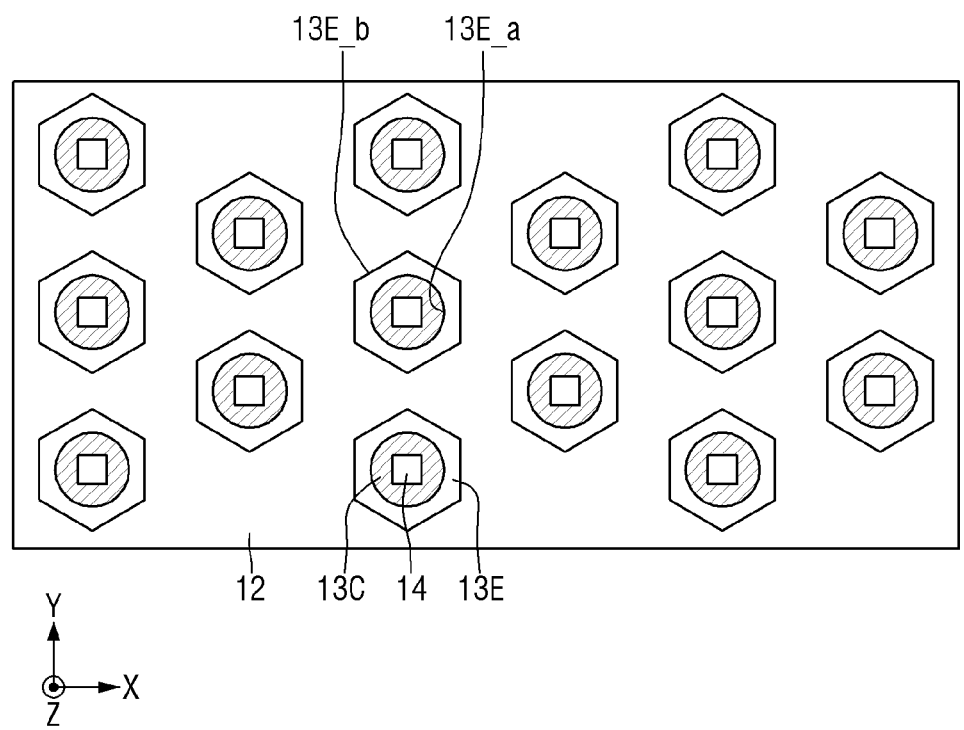

In FIG. 9, the outer side 13E_b of the edge pad 13E may have a hexagonal shape, e.g., in a plan view. In this case, the width of the edge pad 13E may differ depending on positon and/or on direction, e.g., in a plan view.

Figure 10:
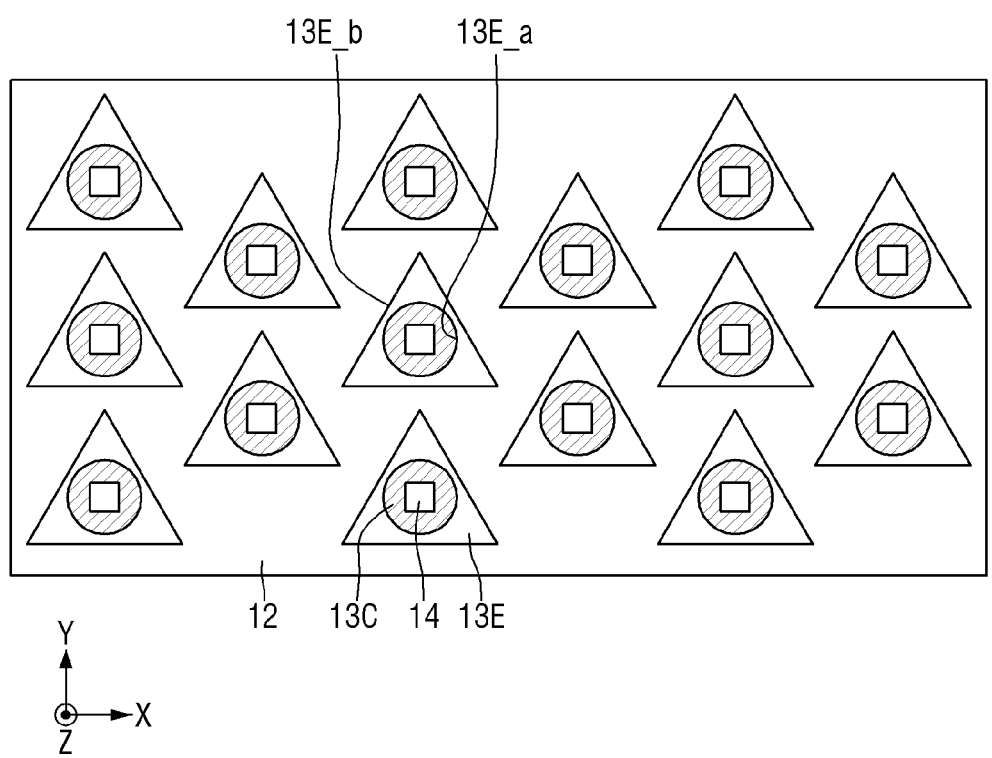

In FIG. 10, the outer side 13E_b of the edge pad 13E may have a triangular shape, e.g., in a plan view. In this case, the width of the edge pad 13E may differ depending on positon and/or on direction, e.g., in a plan view.

In the present specification, although the outer side 13E_b of the edge pad 13E is shown to include one of a circular shape, a square shape, a hexagonal shape and a triangular shape, the embodiment is not limited thereto. The outer side 13E_b of the edge pad 13E may have various shapes, e.g., in a plan view. For example, the outer side 13E_b of the edge pad 13E may be a circle, a quadrangle, a triangle, or a hexagon in a plan view.

Figure 11:
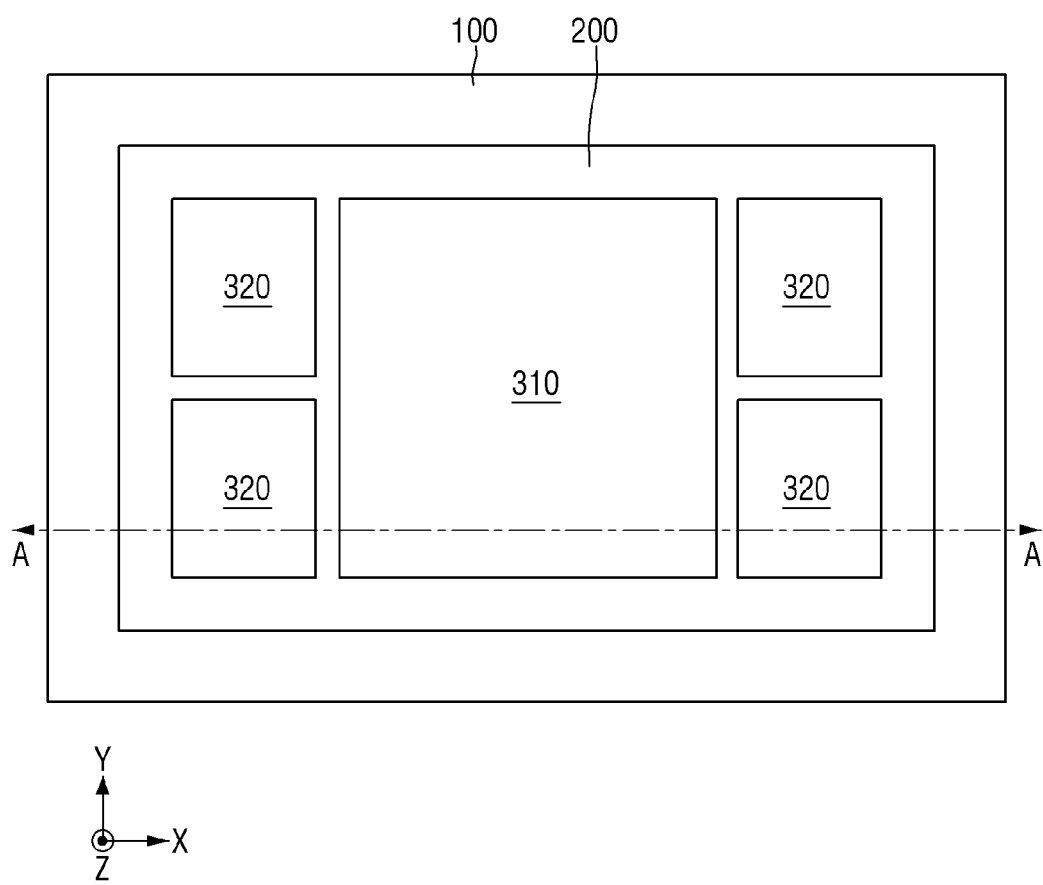
FIG. 11 is a schematic layout diagram for explaining a semiconductor package according to some embodiments.
Figure 12:
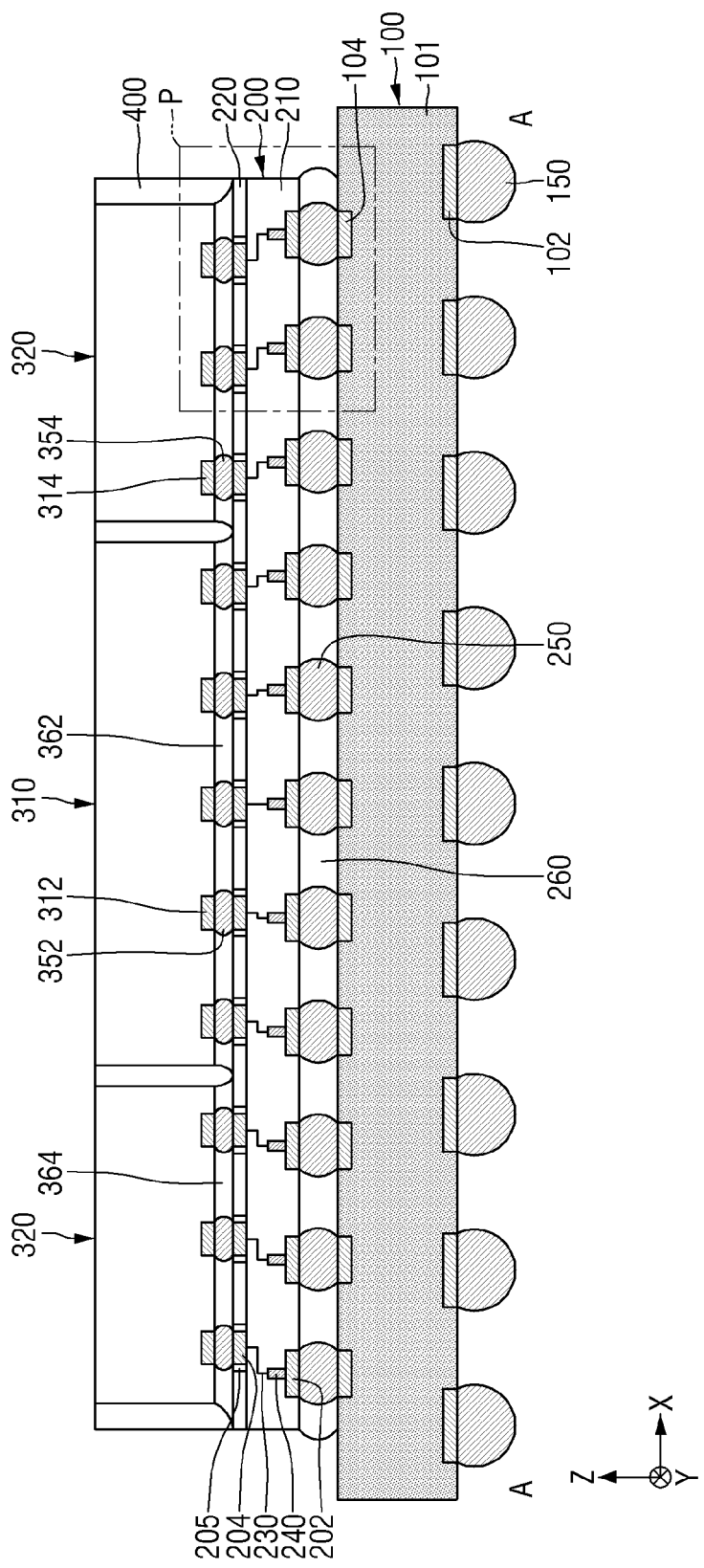
FIG. 12 is a cross-sectional view taken along A-A of FIG. 11.

FIG. 11 is a schematic layout diagram for explaining a semiconductor package according to some embodiments. FIG. 12 is a cross-sectional view taken along A-A of FIG. 11. FIG. 13 is an enlarged view for explaining a region P of FIG. 12. Hereinafter, the semiconductor package including the edge pad described using FIGS. 1 to 10 will be described.

In FIGS. 11 to 13, the semiconductor package according to some embodiments may be a 2.5D package including a silicon interposer. However, this is only an example, and the technical idea of the present disclosure is not limited thereto.

Referring to FIGS. 11 to 13, the semiconductor package according to some embodiments may include a circuit board 100, an interposer structure 200, a first semiconductor chip 310, a second semiconductor chip 320, and a molding member 400.

The interposer structure 200 may be mounted on the circuit board 100. A first semiconductor chip 310 and a second semiconductor chip 320 may be mounted on the interposer structure 200. The first semiconductor chip 310 and the second semiconductor chip 320 may be placed apart from each other in the first direction X. Second semiconductor chips 320 may be placed on one side and the other side of the first semiconductor chip 310. Two or more second semiconductor chips 320 may be arranged in the third direction Y. The second semiconductor chips 320 may be spaced apart from each other in the third direction Y. The third direction Y may be perpendicular to the first direction X and the second direction Z.

The circuit board 100 may be a packaging board. The circuit board 100 may be a printed circuit board (PCB). The circuit board 100 may include an upper side (e.g., a top/upper surface) and a lower side (e.g., a bottom/lower surface) that are opposite to each other.

The circuit board 100 may include an insulating core 101, a first board pad 102, and a second board pad 104. For example, the circuit board 100 may include a plurality of first board pads 102, and a plurality of second board pads 104. The first board pads 102 and the second board pads 104 may be used to electrically connect the circuit board 100 to other components. For example, the first board pad 102 may be exposed from the lower surface/side of the insulating core 101, and the second board pad 104 may be exposed from the upper surface/side of the insulating core 101. The first board pad 102 and the second board pad 104 may include or be formed of, but are not limited to, metallic materials such as, for example, copper (Cu) or aluminum (Al).

Wiring patterns for electrically connecting the first board pad 102 and the second board pad 104 may be formed inside the insulating core 101. Although the insulating core 101 is shown as a single layer, this is only for convenience of explanation. For example, it is a matter of course that an insulating core 101 is made up of multiple layers in certain embodiments, and multi-layered wiring patterns may be formed inside the insulating core 101.

The circuit board 100 may be mounted on a motherboard or the like of an electronic device. For example, a first connecting member 150 electrically connected to the first board pad 102 may be formed. The circuit board 100 may be mounted on a motherboard or the like of an electronic device through the first connecting member 150. The circuit board 100 may be, but is not limited to, a BGA (Ball Grid Array board).

The first connecting member 150 may be, for example, but is not limited to, a solder bump. The first connecting member 150 may have various shapes such as a land, a ball, a pin, and a pillar. It is a matter of course that the number, gap, arrangement form, and the like of the first connecting member 150 are not limited to those shown and may differ depending on the design.

In some embodiments, the insulating core 101 may include or be formed of an organic matter. For example, the insulating core 101 may include or be formed of a pre-preg. The pre-preg is a composite fiber in which reinforcing fibers such as carbon fiber, glass fiber, and aramid fiber are impregnated with a thermosetting polymer binder (e.g., epoxy resin) or a thermoplastic resin in advance.

In some embodiments, the circuit board 100 may include or may be a copper clad laminate (CCL). For example, the circuit board 100 may have a structure in which a copper laminate is stacked on one side or both sides of a thermosetting pre-preg (e.g., pre-preg of a C-Stage).

The interposer structure 200 may be placed on the upper surface/side of the circuit board 100. The interposer structure 200 may be, for example, but is not limited to, a silicon interposer. The interposer structure 200 may include a lower side (e.g., a bottom/lower surface) and an upper side (e.g., a top/upper surface) that are opposite to each other. The interposer structure 200 facilitates the electrical connection between the circuit board 100 and first and second semiconductor chips 310 and 320 to be described later, and may prevent warpage of the semiconductor package.

The interposer structure 200 may include a first interposer pad 202 and a second interposer pad 204. The first interposer pad 202 and the second interposer pad 204 may be used to electrically connect the interposer structure 200 to other components, respectively. For example, the first interposer pad 202 may be exposed from the lower side/surface of the interposer structure 200, and the second interposer pad 204 may be exposed from the upper side/surface of the interposer structure 200. The first interposer pad 202 and the second interposer pad 204 may include or be formed of, for example, but are not limited to, metallic materials such as copper (Cu) or aluminum (Al). Wiring patterns for electrically connecting the first interposer pad 202 and the second interposer pad 204 may be formed inside the interposer structure 200.

The interposer structure 200 may be mounted on the upper side/surface of the circuit board 100. For example, a second connecting member 250 may be formed/disposed between the circuit board 100 and the interposer structure 200. The second connecting member 250 may electrically connect the second board pad 104 and the first interposer pad 202. Accordingly, the circuit board 100 and the interposer structure 200 may be electrically connected through the second connecting member 250.

The second connecting member 250 may be, but is not limited to, a solder bump including a low-melting point metal, for example, tin (Sn), tin (Sn) alloy or the like. The second connecting member 250 may have various shapes such as a land, a ball, a pin, and a pillar. The second connecting member 250 may be formed of a single layer or multiple layers. When the second connecting member 250 is formed of a single layer, the second connecting member 250 may include or be formed of, for example, tin-silver (Sn—Ag) solder or copper (Cu). When the second connecting member 250 is formed of multiple layers, the second connecting member 250 may include, for example, a copper (Cu) filler and solder. It is a matter of course that the number, gap, arrangement form, and the like of the second connecting member 250 are not limited to those shown in the drawings and may vary depending on the design.

In some embodiments, the interposer structure 200 may be an interposer substrate and may include an interposer 210, a through via 240, and a redistribution layer 230.

The interposer 210 may be, for example, but is not limited to, a silicon film. The through via 240 may be placed inside the interposer 210. For example, the through via 240 may be placed inside the interposer 210 and electrically connected to the first interposer pad 202.

In some embodiments, a first underfill 260 may be formed between the circuit board 100 and the interposer structure 200. The first underfill 260 may fill a space between the circuit board 100 and the interposer structure 200. Further, the first underfill 260 may cover the second connecting member 250. For example, the first underfill 260 may surround and contact side walls of second connecting members 250. The first underfill 260 may prevent the interposer structure 200 from being broken or the like by fixing the interposer structure 200 onto the circuit board 100. The first underfill 260 may include or be formed of, for example, but is not limited to, an insulating polymeric material such as an EMC (epoxy molding compound).

In some embodiments, the interposer structure 200 may include a passivation film 220 and a stress relaxation pad 205. The stress relaxation pad 205 may be, for example, the edge pad 13E of FIG. 1. For example, the stress relaxation pad 205 may relax the thermal stress of the passivation film 220.

The stress relaxation pad 205 may be formed on the upper side/surface 210 US of the interposer 210. The stress relaxation pad 205 may be placed around the second interposer pad 204. The stress relaxation pad 205 may surround the second interposer pad 204. The stress relaxation pad 205 may come into contact with the second interposer pad 204. The inner side of the stress relaxation pad 205 may come into contact with the second interposer pad 204. For example, a plurality of stress relaxation pads 205 may respectively surround and contact side surfaces of the second interposer pads 204.

The passivation film 220 may extend on the upper side/surface 210 US of the interposer 210. The passivation film 220 may come into contact with the stress relaxation pad 205. The outer side of the stress relaxation pad 205 may come into contact with the passivation film 220. For example, the passivation film 220 may surround and contact side surfaces of the stress relaxation pads 205. The stress relaxation pad 205 and the second interposer pad 204 may each penetrate the passivation film 220, e.g., in the second direction Z, and come into contact with the upper side/surface 210 US of the interposer 210.

When the semiconductor package according to some embodiment is exposed to a high temperature, the thermal stress may be concentrated on the passivation film 220. The second connecting member 250 may have a higher coefficient of thermal expansion (CTE) than the passivation film 220. The thermal stress may be concentrated on the passivation film 220 due to a difference in the coefficient of thermal expansion between the second connecting member 250 and the passivation film 220.

The stress relaxation pad 205 of the semiconductor package according to some embodiments of the present disclosure may be placed between the second interposer pads 204 and the passivation film 220 to relax the thermal stress of the passivation film 220.

The stress relaxation pad 205 may be the edge pad 13E described in FIG. 1. The stress relaxation pad 205 may include or be formed of an insulating material. The stress relaxation pad 205 may include or be formed of, for example, TEOS or PSPI.

In a cross-section, a width W1 of the stress relaxation pad 205 in the first direction X may be 1 µm or more and 20 µm or less. For example, the width W1 of the stress relaxation pad 205 in the first direction X may be 1 µm or more and 10 µm or less. For example, the width W1 of the stress relaxation pad 205 in the first direction X may be 5 µm or more and 10 µm or less. The coefficient of thermal expansion of the stress relaxation pad 205 may be 1 ppm/K or more and 17 ppm/K or less. The modulus of the stress relaxation pad 205 may be smaller than the modulus of the second interposer pad 204. For example, the modulus of the stress relaxation pad 205 may be greater than 15 GPa and smaller than 117 GPa. However, the technical idea of the present disclosure is not limited thereto.

In a plan view, the stress relaxation pad 205 may include an inner side that comes into contact with the second interposer pad 204, and an outer side that comes into contact with the passivation film 220. The outer side of the stress relaxation pad 205 may have a circular shape, a square shape, a triangular shape or a hexagonal shape. However, the technical idea of the present disclosure is not limited thereto.

The passivation film 220 may be, for example, but is not limited to, a silicon nitride film. The passivation film 220 may also be formed of a passivation material, BCB (benzocyclobutene), polybenzeneoxazole, polyimide, epoxy, silicon oxide, silicon nitride or a combination thereof in certain embodiments.

An upper side/surface 205_US of the stress relaxation pad 205 may be located on the same plane as the upper side/surface 204_US of the second interposer pad 204. The upper side/surface 205_US of the stress relaxation pad 205 may be located on the same plane as the upper side/surface 220_US of the passivation film 220. The upper side/surface 205_US of the stress relaxation pad 205, the upper side/surface 204_US of the second interposer pad 204, and the upper side/surface 220_US of the passivation film 220 may be/constitute the upper side/surface of the interposer structure 200.

The first semiconductor chip 310 and the second semiconductor chip 320 may be spaced apart from each other in the first direction X and placed on the upper side/surface of the interposer structure 200. The first semiconductor chip 310 and the second semiconductor chip 320 may each be an integrated circuit (IC) in which hundreds to millions or more of semiconductor elements are integrated in a single chip.

In some embodiments, the first semiconductor chip 310 may be a logic semiconductor chip. For example, the first semiconductor chip 310 may be, for example, but is not limited to, an application processor (AP), such as a CPU (Central Processing Unit), a GPU (Graphic Processing Unit), an FPGA (Field-Programmable Gate Array), a digital signal processor, an encryption processor, a microprocessor, a microcontroller, and an ASIC (Application-Specific IC).

In some embodiments, the second semiconductor chip 320 may be a memory semiconductor chip. For example, the second semiconductor chip 320 may be a volatile memory such as a DRAM (dynamic random access memory) or an SRAM (static random access memory), or may be a nonvolatile memory such as a flash memory, a PRAM (Phase change Random Access Memory), a MRAM (Magnetoresistive Random Access Memory), a FeRAM (Ferroelectric Random Access Memory) or a RRAM (Resistive Random Access Memory).

As an example, the first semiconductor chip 310 may be an ASIC such as a GPU, and the second semiconductor chip 320 may be a stack memory such as a high bandwidth memory (HBM). Such a stack memory may have a form in which a plurality of integrated circuits are stacked. The stacked integrated circuits may be electrically connected to each other through a TSV (Through Silicon Via) or the like.

In some embodiments, the number of second semiconductor chips 320 may be provided more than the number of first semiconductor chips 310. For example, a plurality of second semiconductor chips 320 may be placed around the first semiconductor chip 310. As an example, as shown in FIG. 11, two second semiconductor chips 320 may each be placed on both sides of the first semiconductor chip 310.

The first semiconductor chip 310 may include a first chip pad 312. The first chip pad 312 may be used to electrically connect the first semiconductor chip 310 to other components. For example, the first chip pad 312 may be exposed from the lower side/surface of the first semiconductor chip 310.

The second semiconductor chip 320 may include a second chip pad 314. The second chip pad 314 may be used to electrically connect the second semiconductor chip 320 to other components. For example, the second chip pad 314 may be exposed from the lower side/surface of the second semiconductor chip 320.

The first chip pad 312 and the second chip pad 314 may each include or be formed of, for example, but are not limited to, a metallic material such as copper (Cu) or aluminum (Al).

The first semiconductor chip 310 and the second semiconductor chip 320 may be mounted on the upper side/surface of the interposer structure 200. For example, a third connecting member 352 may be formed/disposed between the interposer structure 200 and the first semiconductor chip 310. The third connecting member 352 may electrically connect some of the plurality of second interposer pads 204 to the first chip pad 312. For example, the third connecting member 352 may contact some of the plurality of second interposer pads 204 and the first chip pad 312. Accordingly, the interposer structure 200 and the first semiconductor chip 310 may be electrically connected to each other.

Further, for example, a fourth connecting member 354 may be formed/disposed between the interposer structure 200 and the second semiconductor chip 320. The fourth connecting member 354 may electrically connect some others of the plurality of second interposer pads 204 to the second chip pad 314. For example, the fourth connecting member 354 may contact some others of the plurality of second interposer pads 204 and the second chip pad 314. Accordingly, the interposer structure 200 and the second semiconductor chip 320 may be electrically connected.

In some embodiments, a part of the redistribution layer 230 may electrically connect the third connecting member 352 and the fourth connecting member 354. For example, a part of the redistribution layer 230 may electrically connect the second interposer pad 204 connected to the third connecting member 352 with the second interposer pad 204 electrically connected to the fourth connecting member 354. Accordingly, the first semiconductor chip 310 and the second semiconductor chip 320 may be electrically connected.

The third connecting member 352 and the fourth connecting member 354 may each be, but are not limited to, a solder bump including low melting point metals, for example, tin (Sn) and tin (Sn) alloys. The third connecting member 352 and the fourth connecting member 354 may have various shapes such as a land, a ball, a pin, and a pillar. The third connecting member 352 and the fourth connecting member 354 may include or may be, but are not limited to, a UBM (Under Bump Metallurgy).

In some embodiments, a second underfill 362 may be formed between the interposer structure 200 and the first semiconductor chip 310, and a third underfill 364 may be formed between the interposer structure 200 and the second semiconductor chip 320. The second underfill 362 may fill a space between the interposer structure 200 and the first semiconductor chip 310, and the third underfill 364 may fill a space between the interposer structure 200 and the second semiconductor chip 320. Further, the second underfill 362 may cover the third connecting member 352, and the third underfill 364 may cover the fourth connecting member 354. For example, the second underfill 362 may surround and contact side surfaces of third connecting members 352, and the third underfill 364 may surround and contact side surfaces of fourth connecting members 354. The second underfill 362 and the third underfill 364 may prevent the first and second semiconductor chips 310 and 320 from being broken, by fixing the first and second semiconductor chips 310 and 320 onto the interposer structure 200. The second underfill 362 and the third underfill 364 may each include or be formed of, for example, but are not limited to, an insulating polymeric material such as an EMC.

The molding member 400 may be formed on the upper side (top/upper surface) of the interposer structure 200. The molding member 400 may be formed to cover at least a part of the first and second semiconductor chips 310 and 320. For example, the molding member 400 may cover/contact the side faces of the first semiconductor chip 310, the side faces of the second semiconductor chip 320, the second underfill 362 and the third underfill 364. Although the molding member 400 is only shown as exposing the upper side (top/upper surface) of the first semiconductor chip 310 and the upper side (top/upper surface) of the second semiconductor chip 320, this is merely an example, and the molding member 400 may, of course, cover the upper side (top/upper surface) of the first semiconductor chip 310 and the upper side (top/upper surface) of the second semiconductor chip 320.

The molding member 400 may include or be formed of, but is not limited to, an insulating polymeric material such as an EMC. In some embodiments, the first underfill 260, the second underfill 362 and the third underfill 364 may include or be formed of materials different from the molding member 400. For example, the first underfill 260, the second underfill 362, and the third underfill 364 may each include or be formed of an insulating material having fluidity that is superior to the molding member 400. Accordingly, the first underfill 260, the second underfill 362, and the third underfill 364 may efficiently fill the narrow space between the circuit board 100 and the interposer structure 200, or between the interposer structure 200 and the first and second semiconductor chips 310 and 320.

Figure 14:
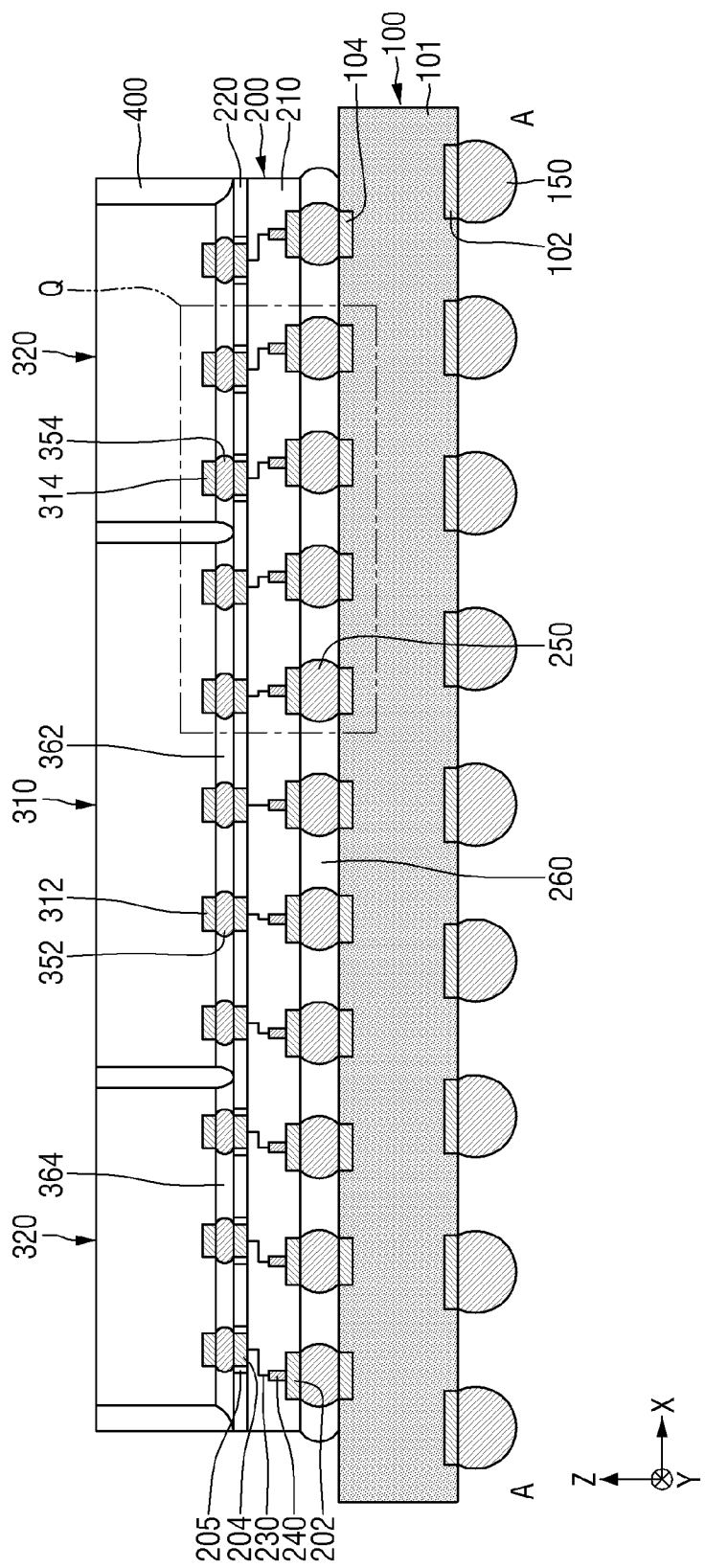
FIG. 14 is a diagram for explaining a semiconductor package according to some embodiments.
Figure 15:
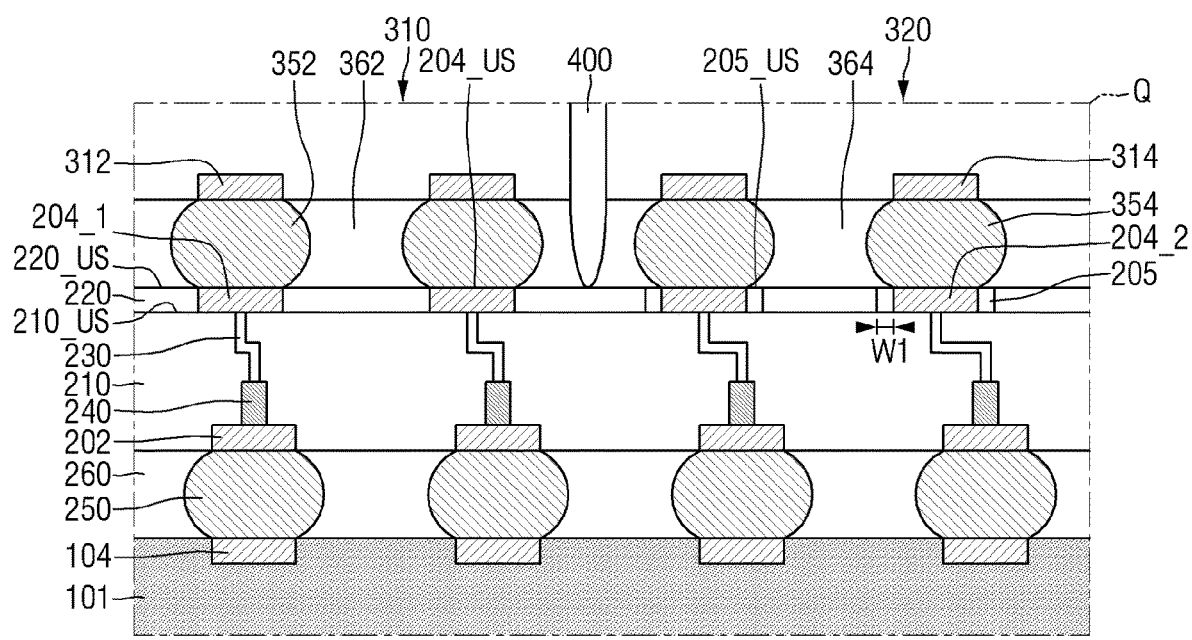
FIG. 15 is an enlarged view for explaining a region Q of FIG. 14.

FIG. 14 is a diagram for explaining a semiconductor package according to some embodiments. FIG. 15 is an enlarged view for explaining a region Q of FIG. 14. For convenience of explanation, features/points different from those described using FIGS. 11 to 13 will be mainly described.

Referring to FIGS. 14 and 15, the stress relaxation pad 205 may not be placed around the second interposer pad 204 electrically connected to the first semiconductor chip 310.

In some embodiments, the second interposer pad 204 may include a second_1 interposer pad 204_1 and a second_2 interposer pad 204_2.

The second_1 interposer pad 204_1 may be a second interposer pad 204 electrically connected to the first semiconductor chip 310. The second_2 interposer pad 204_2 may be a second interposer pad 204 electrically connected to the second semiconductor chip 320. The second_1 interposer pad 204_1 may be electrically connected to and/or contact the third connecting member 352. The second_1 interposer pad 204_1 may be electrically connected to the first chip pad 312, e.g., through the third connecting member 352. The second_2 interposer pad 204_2 may be electrically connected to and/or contact the fourth connecting member 354. The second_2 interposer pad 204_2 may be electrically connected to the second chip pad 314, e.g., through the fourth connecting member 354.

The stress relaxation pad 205 may not be placed around the second_1 interposer pad 204_1. The stress relaxation pad 205 may not be placed around the second_1 interposer pad 204_1 which is the second interposer pad 204 electrically connected to the first semiconductor chip 310. For example, the stress relaxation pad 205 may not be formed around the second interposer pad 204 electrically connected to the logic semiconductor chip.

The stress relaxation pad 205 may be placed around the second_2 interposer pad 204_2. The stress relaxation pad 205 may be placed around the second_2 interposer pad 204_2 which is the second interposer pad 204 electrically connected to the second semiconductor chip 320. For example, the stress relaxation pad 205 may be formed around the second interposer pad 204 electrically connected to the memory semiconductor chip.

Figure 16:
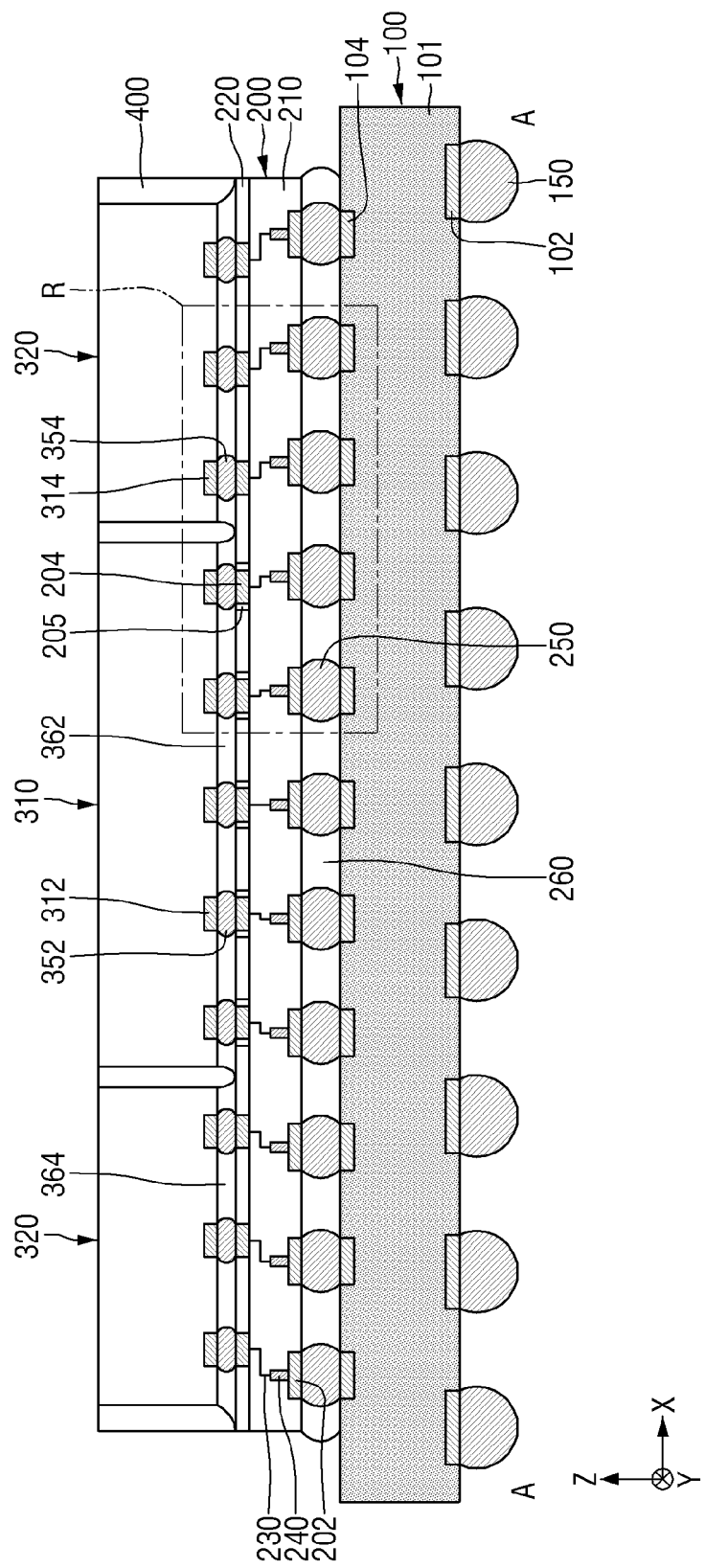
FIG. 16 is a diagram for explaining a semiconductor package according to some embodiments.
Figure 17:
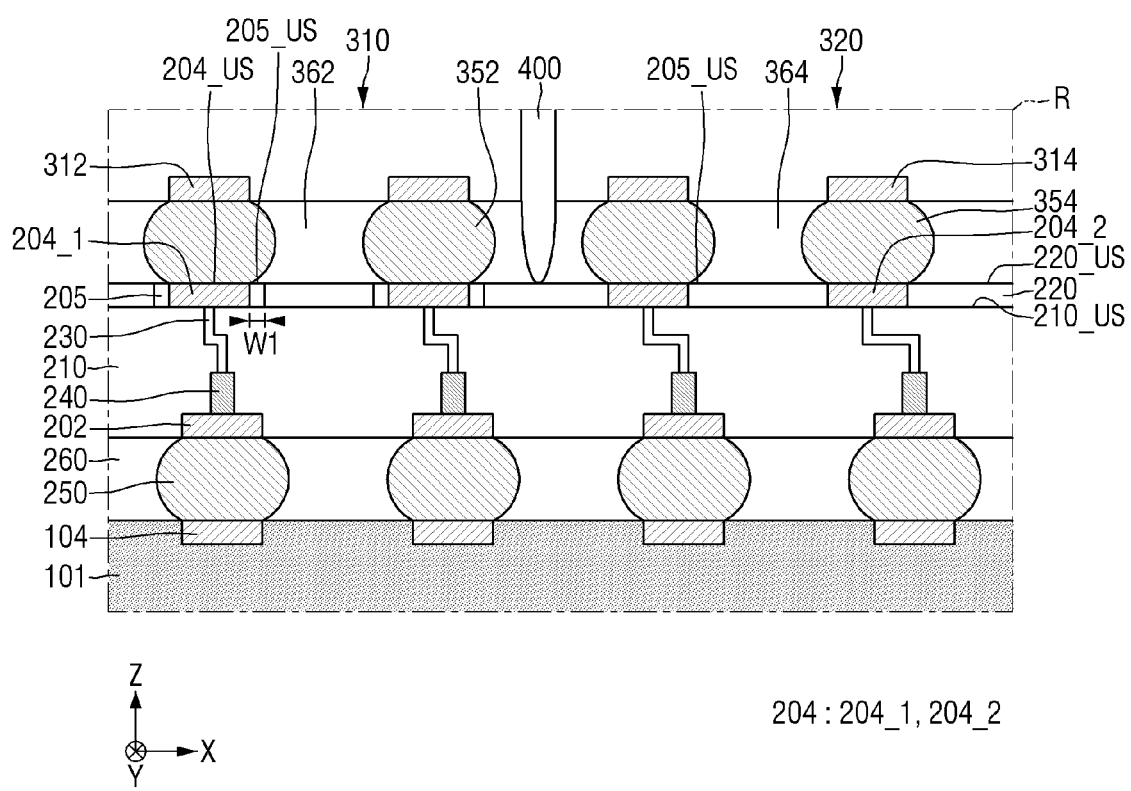
FIG. 17 is an enlarged view for explaining a region R of FIG. 16.

FIG. 16 is a diagram for explaining a semiconductor package according to some embodiments. FIG. 17 is an enlarged view for explaining a region R of FIG. 16. For convenience of explanation, features/points different from those described using FIGS. 11 to 15 will be mainly described.

Referring to FIGS. 16 and 17, the stress relaxation pad 205 may not be placed around the second_2 interposer pad 204_2.

The stress relaxation pad 205 may not be placed around the second_2 interposer pad 204_2. The stress relaxation pad 205 may not be placed around the second_2 interposer pad 204_2 which is the second interposer pad 204 electrically connected to the second semiconductor chip 320. For example, the stress relaxation pad 205 may not be formed around the second interposer pad 204 electrically connected to the logic semiconductor chip.

The stress relaxation pad 205 may be placed around the second_1 interposer pad 204_1. The stress relaxation pad 205 may be placed around the second_1 interposer pad 204_1 which is the second interposer pad 204 electrically connected to the first semiconductor chip 310. For example, the stress relaxation pad 205 may be formed around the second interposer pad 204 electrically connected to the memory semiconductor chip.

Figure 18:
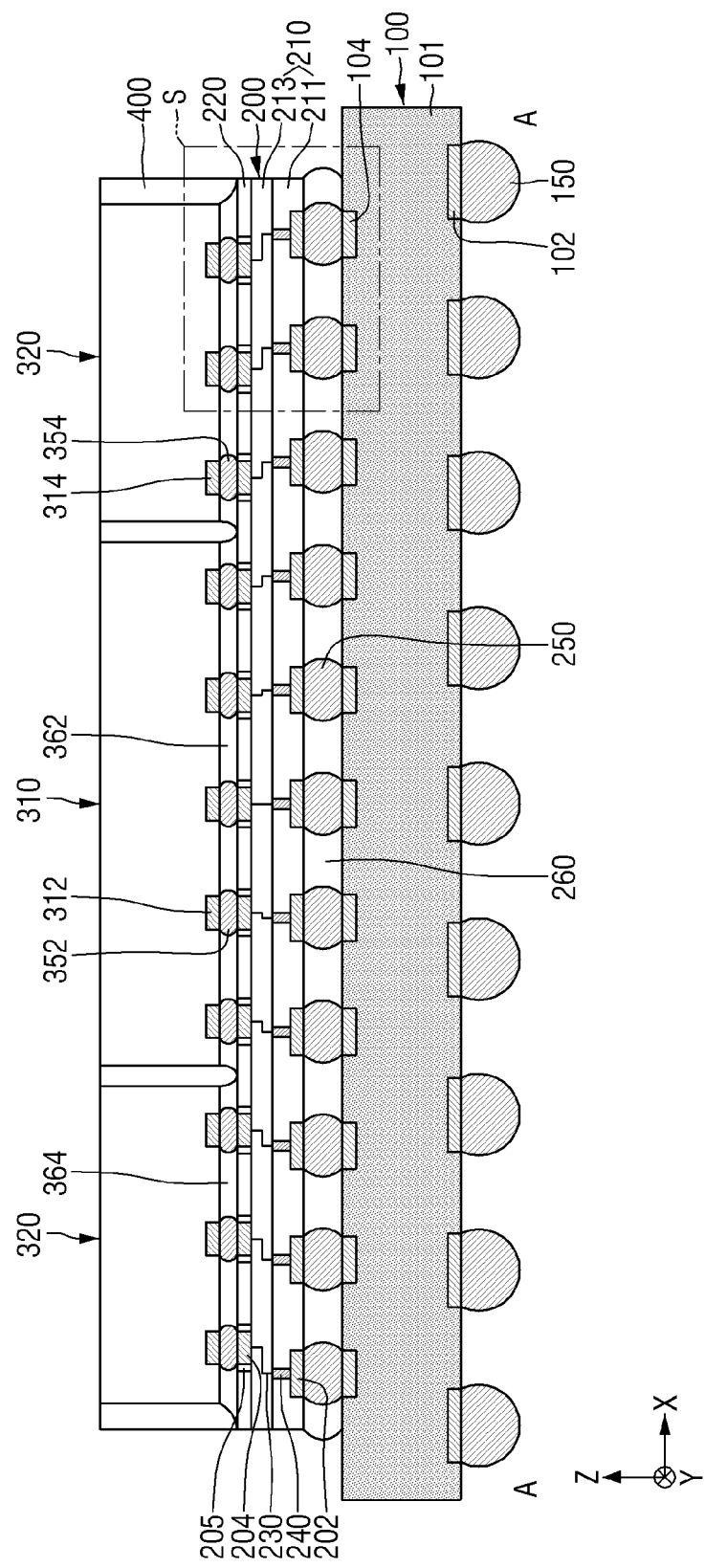
FIG. 18 is a diagram for explaining a semiconductor package according to some embodiments.
Figure 19:
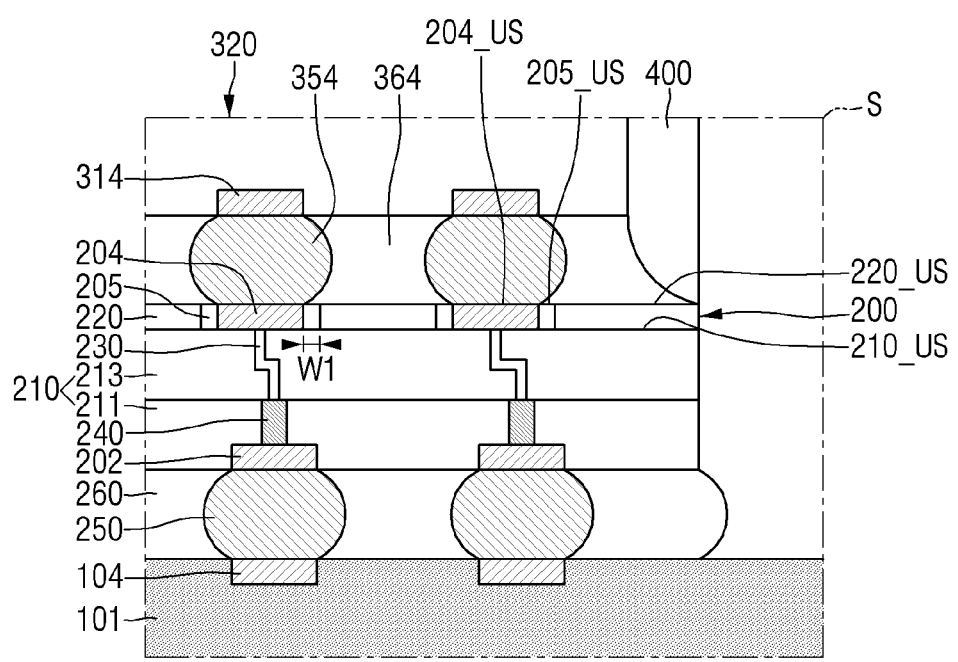
FIG. 19 is an enlarged view for explaining a region S of FIG. 18.

FIG. 18 is a diagram for explaining a semiconductor package according to some embodiments. FIG. 19 is an enlarged view for explaining a region S of FIG. 18. For convenience of explanation, features/points different from those described using FIGS. 11 to 13 will be mainly described.

Referring to FIGS. 18 and 19, the interposer 210 may be multiple layers. For example, the interposer 210 may include a semiconductor film 211 and an interlayer insulating film 213.

The semiconductor film 211 may be, for example, but is not limited to, a silicon film. The through via 240 may penetrate the semiconductor film 211. For example, the through via 240 may extend from the top/upper surface/side of the semiconductor film 211 and be electrically connected to and/or contact the first interposer pad 202.

The interlayer insulating film 213 may cover the top/upper side/surface of the semiconductor film 211. The interlayer insulating film 213 may include or be formed of, for example, but is not limited to, at least one of silicon oxide, silicon nitride, silicon oxynitride, and low-k materials having a lower dielectric constant than silicon oxide. The redistribution layer 230 may be formed inside the interlayer insulating film 213. The redistribution layer 230 may electrically connect the through via 240 to the second interposer pad 204.

Figure 20:
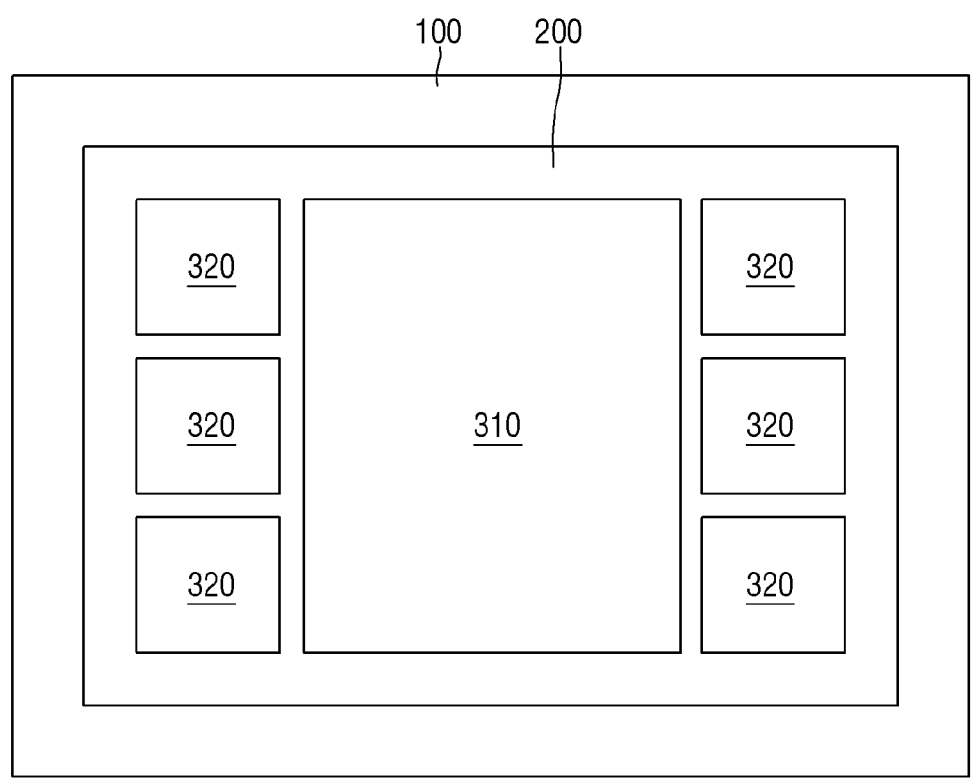
FIG. 20 is an exemplary layout diagram of a semiconductor package according to some embodiments.

FIG. 20 is an exemplary layout diagram of a semiconductor package according to some embodiments. For convenience of explanation, features/points different from those described using FIGS. 11 to 13 will be mainly described.

Referring to FIG. 20, in the semiconductor package according to some embodiments, six second semiconductor chips 320 may be placed around the first semiconductor chip 310.

For example, the second semiconductor chips 320 may be placed side by side in the third direction Y on one side of the first semiconductor chip 310. The second semiconductor chips 320 may be placed side by side in the third direction Y on the other side of the first semiconductor chip 310. For example, six memory semiconductor chips may be placed around the single logic semiconductor chip.

Figure 21:
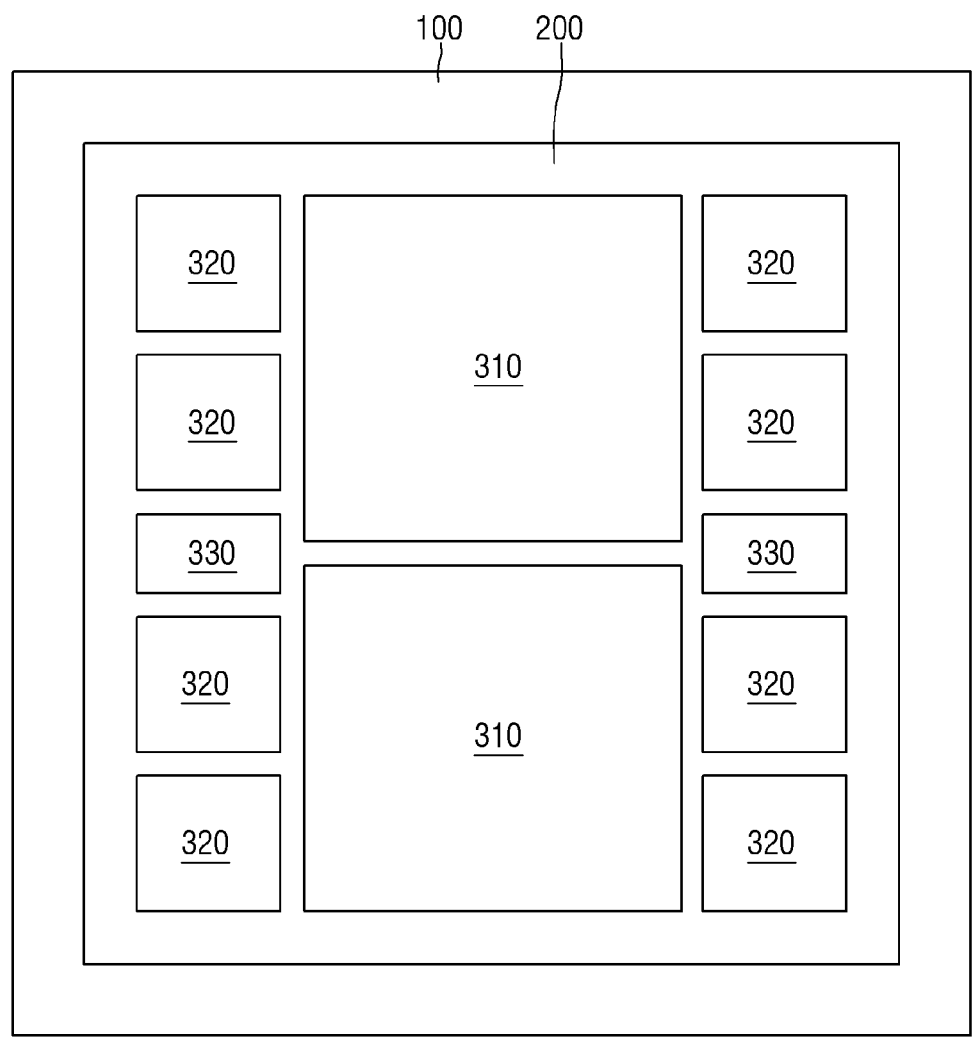
FIG. 21 is an exemplary layout diagram of a semiconductor package according to some embodiments.

FIG. 21 is an exemplary layout diagram of the semiconductor package according to some embodiments. For convenience of explanation, features/points different from those described using FIGS. 11 to 13 will be mainly described.

Referring to FIG. 21, the semiconductor package according to some embodiments may include a dummy chip 330.

The dummy chip 330 may not function as the semiconductor chip. For example, the dummy chip 330 may not function as an integrated circuit chip. The dummy chip 330 may be arranged with, for example, the first semiconductor chips 310 along the first direction X. As an example, as shown in FIG. 21, two first semiconductor chips 310 may each be placed on both sides of the dummy chip 330. For example, the dummy chips 330 may be disposed on both sides of the first semiconductor chips 310. For example, each of the dummy chips 330 may be disposed between two second semiconductor chips 320 in the third direction Y.

Figure 22:
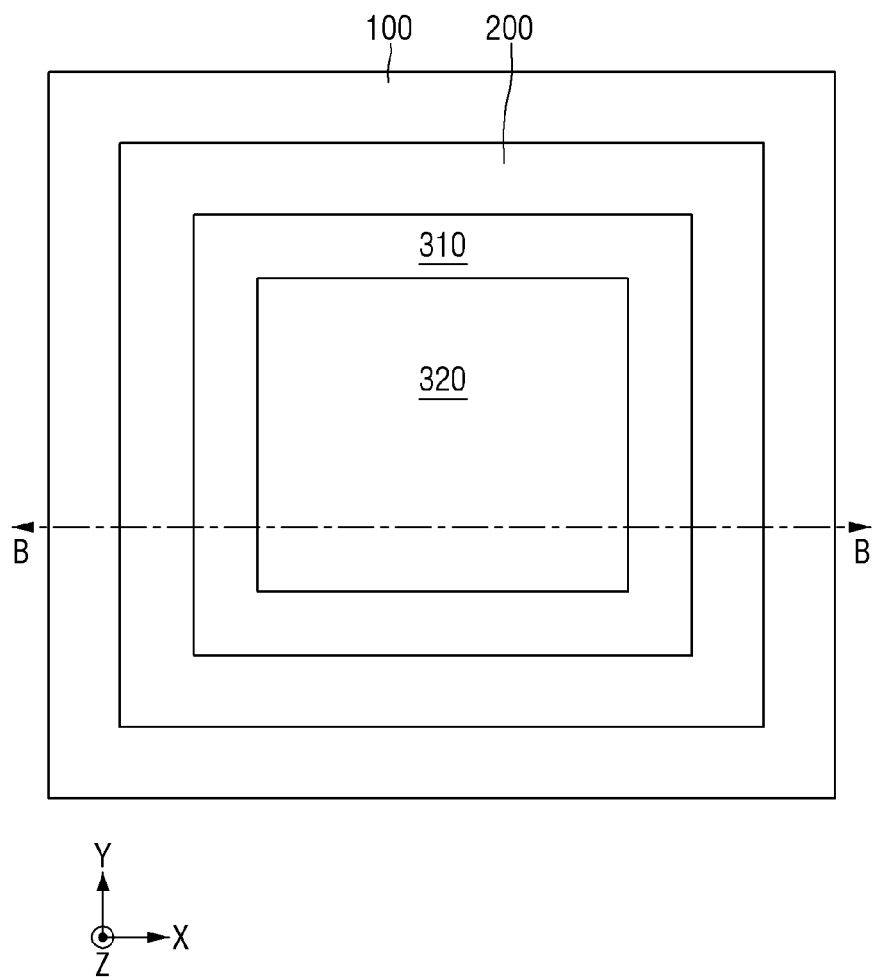
FIG. 22 is an exemplary layout diagram of a semiconductor package according to some embodiments.
Figure 23:
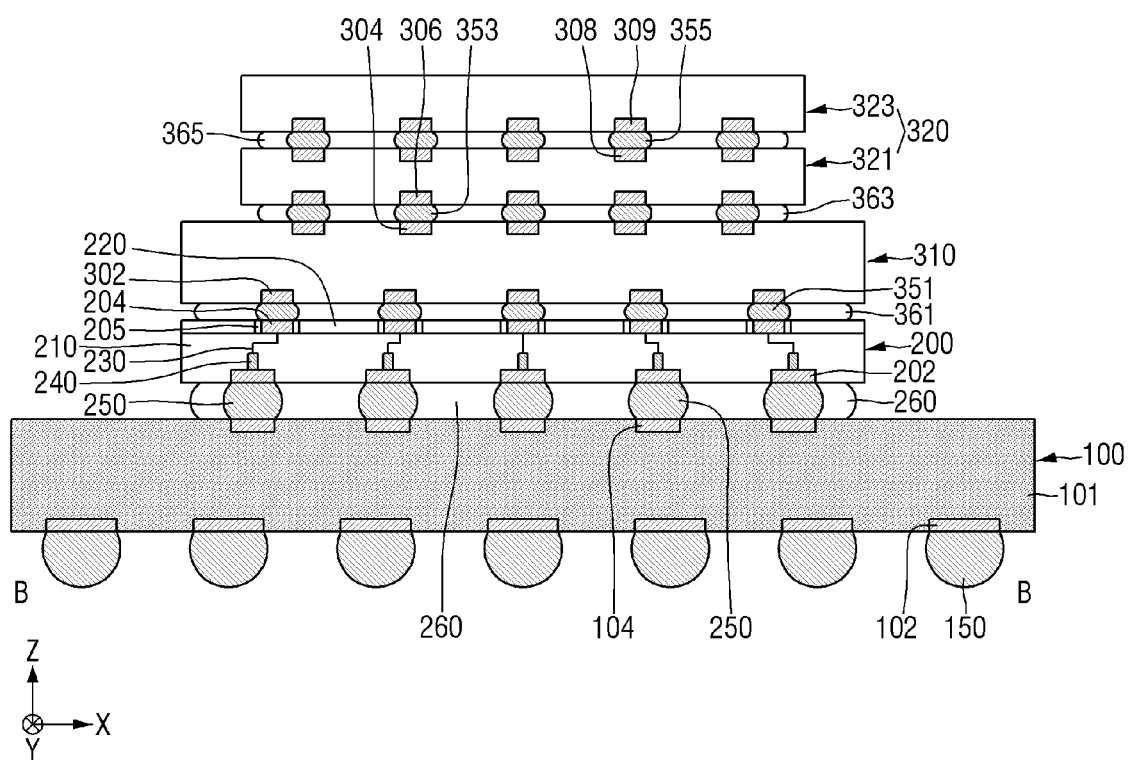
FIG. 23 is a cross-sectional view taken along a line B-B of FIG. 22.

FIG. 22 is an exemplary layout diagram of the semiconductor package according to some embodiments. FIG. 23 is a cross-sectional view taken along a line B-B of FIG. 22. For convenience of explanation, features/points different from those described using FIGS. 11 to 13 will be mainly described.

In FIGS. 22 and 23, the semiconductor package according to some embodiments may be a 3D package including a silicon interposer. However, this is merely an example, and the technical idea of the present disclosure is not limited thereto.

Referring to FIGS. 22 and 23, the semiconductor package according to some embodiments may include a circuit board 100, an interposer structure 200, a first semiconductor chip 310, and a second semiconductor chip 320.

In some embodiments, the first semiconductor chip 310 and the second semiconductor chip 320 may be stacked sequentially. The first semiconductor chip 310 may be spaced apart from the second semiconductor chip 320 in the second direction Z. For example, the second semiconductor chip 320 may be formed/disposed on the first semiconductor chip 310. At least one or more second semiconductor chips 320 may be provided. In FIG. 23, a second_1 semiconductor chip 321 and a second_2 semiconductor chip 323 may be sequentially stacked on the first semiconductor chip 310. Although the two second semiconductor chips 320 are shown, this is merely for convenience of explanation, and the embodiment is not limited thereto.

The circuit board 100 may be a packaging board. The circuit board 100 may be a printed circuit board (PCB). The circuit board 100 may include an insulating core 101, a first board pad 102 and a second board pad 104.

The circuit board 100 may be mounted on a motherboard or the like of an electronic device. For example, a first connecting member 150 electrically connected to and/or in contact with the first board pad 102 may be formed/disposed on a bottom surface of the circuit board 100. The circuit board 100 may be mounted on a motherboard or the like of an electronic device through the first connecting member 150.

The interposer structure 200 may be placed on the upper/top side/surface of the circuit board 100. The interposer structure 200 may be, for example, but is not limited to, a silicon interposer.

The interposer structure 200 may be mounted on the upper/top side/surface of the circuit board 100. For example, a second connecting member 250 may be formed/disposed between the circuit board 100 and the interposer structure 200. The second connecting member 250 may electrically connect the second board pad 104 and the first interposer pad 202. Accordingly, the circuit board 100 and the interposer structure 200 may be electrically connected, e.g., through the second connecting member 250.

In some embodiments, a first underfill 260 may be formed between the circuit board 100 and the interposer structure 200. The first underfill 260 may fill the space between the circuit board 100 and the interposer structure 200.

The interposer structure 200 may include an interposer 210, and a passivation film 220, a second interposer pad 204 and a stress relaxation pad 205 placed on the upper/top side/surface of the interposer 210. The stress relaxation pad 205 may be placed between the second interposer pad 204 and the passivation film 220. The stress relaxation pad 205 may relax the thermal stress of the passivation film 220.

The first semiconductor chip 310 may be placed on the upper/top side/surface of the interposer structure 200. The first semiconductor chip 310 may be a logic semiconductor chip. For example, the first semiconductor chip 310 may be, but is not limited to, an application processor (AP), such as a CPU (Central Processing Unit), a GPU (Graphic Processing Unit), an FPGA (Field-Programmable Gate Array), a digital signal processor, an encryption processor, a microprocessor, a microcontroller, and an ASIC (Application-Specific IC).

The first semiconductor chip 310 may include a third chip pad 302 and a fourth chip pad 304. The third chip pad 302 and the fourth chip pad 304 may each be used to electrically connect the first semiconductor chip 310 to other components. For example, the third chip pad 302 may be exposed from the lower/bottom side/surface of the first semiconductor chip 310. The fourth chip pad 304 may be exposed from the upper/top side/surface of the first semiconductor chip 310.

The third chip pad 302 and the fourth chip pad 304 may each include or be formed of, for example, but are not limited to, a metallic material such as copper (Cu) or aluminum (Al).

In some embodiments, a fifth connecting member 351 may be formed/disposed between the interposer structure 200 and the first semiconductor chip 310. The fifth connecting member 351 may electrically connect the second interposer pad 204 and the third chip pad 302. Accordingly, the interposer structure 200 and the first semiconductor chip 310 may be electrically connected to each other, e.g., through the fifth connecting member 351.

The fifth connecting member 351 may be, but is not limited to, a solder bump including or formed of a low melting point metal, for example, tin (Sn) and tin (Sn) alloy. The fifth connecting member 351 may have various shapes such as a land, a ball, a pin, and a pillar. The fifth connecting member 351 may include, but is not limited to, a UBM (Under Bump Metallurgy).

In some embodiments, a fourth underfill 361 may be formed between the interposer structure 200 and the first semiconductor chip 310. The fourth underfill 361 may fill the space between the interposer structure 200 and the first semiconductor chip 310. The fourth underfill 361 may cover the fifth connecting member 351. For example, the fourth underfill 361 may surround and contact side surfaces of fifth connecting members 351. The fourth underfill 361 may prevent the first semiconductor chip 310 from being broken or the like by fixing the first semiconductor chip 310 onto the interposer structure 200. The fourth underfill 361 may include or be formed of, but is not limited to, one or more insulating polymeric materials such as an EMC.

The second semiconductor chips 320 may be placed on the upper/top side/surface of the first semiconductor chip 310. The second semiconductor chips 320 may include a second_1 semiconductor chip 321 and a second_2 semiconductor chip 323. The second_1 semiconductor chip 321 may be mounted on the upper/top side/surface of the first semiconductor chip 310. The second_2 semiconductor chip 323 may be mounted on the upper/top side/surface of the second_1 semiconductor chip 321.

Each of the second_1 semiconductor chip 321 and the second_2 semiconductor chip 323 may be a memory semiconductor chip. For example, the second_1 semiconductor chip 321 and the second_2 semiconductor chip 323 may each be a volatile memory such as a DRAM (dynamic random access memory) or an SRAM (static random access memory), or may be a non-volatile memory such as a flash memory, a PRAM (Phase-change Random Access Memory), a MRAM (Magnetoresistive Random Access Memory), a FeRAM (Ferroelectric Random Access Memory) or a RRAM (Resistive Random Access Memory).

The second_1 semiconductor chip 321 may include a fifth chip pad 306 and a sixth chip pad 308. Each of the fifth chip pad 306 and the sixth chip pad 308 may be used to electrically connect the second_1 semiconductor chip 321 to other components. For example, the fifth chip pad 306 may be exposed from the lower/bottom side/surface of the second_1 semiconductor chip 321. The sixth chip pad 308 may be exposed from the upper/top side/surface of the second_1 semiconductor chip 321.

The fifth chip pad 306 and the sixth chip pad 308 may each include or be formed of, for example, but are not limited to, one or more metallic materials such as copper (Cu) or aluminum (Al).

In some embodiments, a sixth connecting member 353 may be formed/disposed between the first semiconductor chip 310 and the second_1 semiconductor chip 321. The sixth connecting member 353 may electrically connect the fourth chip pad 304 and the fifth chip pad 306. Accordingly, the first semiconductor chip 310 and the second_1 semiconductor chip 321 may be electrically connected, e.g., through the sixth connecting member 353.

The sixth connecting member 353 may be, but is not limited to, a solder bump including a low melting point metal, for example, a tin (Sn) and tin (Sn) alloy. The sixth connecting member 353 may have various shapes such as a land, a ball, a pin, and a pillar. The sixth connecting member 353 may include, but is not limited to, a UBM (Under Bump Metallurgy).

In some embodiments, a fifth underfill 363 may be formed between the first semiconductor chip 310 and the second_1 semiconductor chip 321. The fifth underfill 363 may fill the space between the first semiconductor chip 310 and the second_1 semiconductor chip 321. The fifth underfill 363 may cover the sixth connecting member 353. For example, the fifth underfill 363 may surround and contact side surfaces of the sixth connecting member 353. The fifth underfill 363 may prevent the second_1 semiconductor chip 321 from being broken or the like by fixing the second_1 semiconductor chip 321 onto the first semiconductor chip 310. The fifth underfill 363 may include or be formed of, but is not limited to, an insulating polymeric material such as an EMC.

The second_2 semiconductor chip 323 may include a seventh chip pad 309. The seventh chip pad 309 may be used to electrically connect the second_2 semiconductor chip 323 to other components. For example, the seventh chip pad 309 may be exposed from the lower/bottom side/surface of the second_2 semiconductor chip 323. The seventh chip pad 309 may include or be formed of, but is not limited to, one or more metallic materials such as copper (Cu) or aluminum (Al).

In some embodiments, a seventh connecting member 355 may be formed/disposed between the second_1 semiconductor chip 321 and the second_2 semiconductor chip 323. The seventh connecting member 355 may electrically connect the sixth chip pad 308 and the seventh chip pad 309. Accordingly, the second_1 semiconductor chip 321 and the second_2 semiconductor chip 323 may be electrically connected to each other, e.g., through the seventh connecting member 355.

The seventh connecting member 355 may be, but is not limited to, a solder bump including or formed of a low melting point metal, for example, tin (Sn) and tin (Sn) alloys. The seventh connecting member 355 may have various shapes such as a land, a ball, a pin, and a pillar. The seventh connecting member 355 may include, but is not limited to, an UBM (Under Bump Metallurgy).

In some embodiments, a sixth underfill 365 may be formed between the second_1 semiconductor chip 321 and the second_2 semiconductor chip 323. The sixth underfill 365 may fill the space between the second_1 semiconductor chip 321 and the second_2 semiconductor chip 323. The sixth underfill 365 may cover the seventh connecting member 355. For example, the sixth underfill 35 may surround and contact side surface of the seventh connecting member 355. The sixth underfill 365 may prevent the second_2 semiconductor chip 323 from being broken or the like by fixing the second_2 semiconductor chip 323 onto the second_1 semiconductor chip 321. The sixth underfill 365 may include or be formed of, for example, but is not limited to, an insulating polymeric material such as an EMC.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
   a first device and a second device that are electrically connected to each other,
   wherein the first device includes a substrate, a first pad formed on an upper side of the substrate, and a passivation film formed on the upper side of the substrate and formed to surround the first pad,
   the second device includes a second pad placed to face the first pad, and
   the first pad has a center pad having a first elastic modulus and an edge pad having a second elastic modulus smaller than the first elastic modulus, the edge pad formed to surround the center pad and to directly contact the passivation film,
   wherein an upper side of the center pad, an upper side of the edge pad, and an upper side of the passivation film are located on the same plane,
   wherein a lower side of the center pad, a lower side of the edge pad, and a lower side of the passivation film are located on the same plane, and
   wherein the first pad and the second pad are electrically connected to each other through a solder bump.

2. The semiconductor package of claim 1, wherein a width of the edge pad in a horizontal direction between the center pad and the passivation film is 1 µm or more and 10 µm or less.

3. The semiconductor package of claim 1, wherein the center pad includes a conductive material, and
the edge pad includes an insulating material.

4. The semiconductor package of claim 3, wherein the edge pad includes an oxide-based insulating material, and
the passivation film includes a nitride-based insulating material.

5. The semiconductor package of claim 1, wherein the edge pad includes an inner side that comes into contact with the center pad, and an outer side opposite to the inner side, and
a shape of the outer side is a circle, a quadrangle, a triangle, or a hexagon.

6. The semiconductor package of claim 1, wherein in cross-section, the edge pad includes a first edge pad and a second edge pad respectively placed on one side and the other side of the center pad, and
a width of the first edge pad is different from a width of the second edge pad.

7. The semiconductor package of claim 6, further comprising:
a solder bump which electrically connects the first pad and the second pad,
the first edge pad completely overlaps the solder bump in a vertical direction, and
the second edge pad includes a portion which does not overlap the solder bump in the vertical direction.

8. A semiconductor package comprising:
an interposer substrate; and
a semiconductor chip which is mounted on the interposer substrate and electrically connected to the interposer substrate,
wherein the interposer substrate includes
an interposer,
a passivation film which is in contact with an upper side of the interposer,
an interposer pad which penetrates the passivation film and is electrically connected to a redistribution layer inside the interposer, and
a stress relaxation pad which penetrates the passivation film and surrounds the interposer pad, and
wherein an upper side of the interposer pad is located on the same plane as an upper side of the stress relaxation pad.

9. The semiconductor package of claim 8, wherein a width of the stress relaxation pad is 1 µm or more and 10 µm or less.

10. The semiconductor package of claim 8, wherein an elastic modulus of the stress relaxation pad is greater than 15 GPa and smaller than 117 Gpa.

11. The semiconductor package of claim 8, wherein a coefficient of thermal expansion of the stress relaxation pad is 1 ppm/K or more and 17 ppm/K or less.

12. The semiconductor package of claim 8, wherein the stress relaxation pad includes an inner side that is in contact with the interposer pad, and an outer side opposite to the inner side,
a shape of the outer side is a circle, a quadrangle, a triangle, or a hexagon.

13. A semiconductor package comprising:
a circuit board;
an interposer substrate on the circuit board; and
a logic semiconductor chip and a memory semiconductor chip mounted on the interposer substrate and electrically connected to the interposer substrate,
wherein the interposer substrate includes
an interposer,
an interposer pad which is placed on an upper side of the interposer and includes a conductive material,
a stress relaxation pad which is placed on the upper side of the interposer, surrounds a periphery of the interposer pad, and includes an insulating material, and
a passivation film which surrounds a periphery of the stress relaxation pad, on the upper side of the interposer,
wherein a width of the stress relaxation pad is 1 µm or more and 10 µm or less,
wherein an upper side of the interposer pad is located on the same plane as an upper side of the stress relaxation pad, and
wherein a lower side of the interposer pad is located on the same plane as a lower side of the stress relaxation pad.

14. The semiconductor package of claim 13, wherein the logic semiconductor chip and the memory semiconductor chip are spaced apart from each other in a horizontal direction, and
the semiconductor package further comprises a molding member placed between the logic semiconductor chip and the memory semiconductor chip.

15. The semiconductor package of claim 14, wherein the interposer substrate includes a first interposer pad electrically connected to the logic semiconductor chip, and a second interposer pad electrically connected to the memory semiconductor chip, and
the first interposer pad or the second interposer pad is not surrounded by a stress relaxation pad.

16. The semiconductor package of claim 13, wherein the logic semiconductor chip and the memory semiconductor chip are spaced apart from each other in a vertical direction, and
the logic semiconductor chip is placed between the interposer substrate and the memory semiconductor chip.

* * * * *